(12) United States Patent
Uchiyama et al.

(10) Patent No.: US 6,791,424 B2
(45) Date of Patent: Sep. 14, 2004

(54) PIEZOELECTRIC OSCILLATOR

(75) Inventors: Toshikazu Uchiyama, Kouza-gun (JP); Hitoshi Takanashi, Kouza-gun (JP); Masayuki Ishikawa, Kouza-gun (JP); Koji Hosaka, Kouza-gun (JP); Tomohiro Tamura, Kouza-gun (JP); Yuuichi Oinuma, Kouza-gun (JP); Takehiko Adachi, 4-113, Tooricho, Minami-ku, Yokohama-shi, Kanagawa 232-0056 (JP); Shoji Izumiya, Yokohama (JP)

(73) Assignees: Toyo Communication Equipment Co., Ltd., Kanagawa (JP); Takehiko Adachi, Kanagawa (JP)

(*) Notice: Subject to any disclaimer, the term of this patent is extended or adjusted under 35 U.S.C. 154(b) by 0 days.

(21) Appl. No.: 10/088,420

(22) PCT Filed: Jul. 17, 2001

(86) PCT No.: PCT/JP01/06161

§ 371 (c)(1),
(2), (4) Date: Mar. 13, 2002

(87) PCT Pub. No.: WO02/07302

PCT Pub. Date: Jan. 24, 2002

(65) Prior Publication Data

US 2002/0135433 A1 Sep. 26, 2002

(30) Foreign Application Priority Data

| Jul. 17, 2000 | (JP) | 2000-216582 |
| Aug. 11, 2000 | (JP) | 2000-245093 |
| Sep. 8, 2000 | (JP) | 2000-273520 |
| Sep. 28, 2000 | (JP) | 2000-297465 |
| Mar. 5, 2001 | (JP) | 2001-060689 |
| May 14, 2001 | (JP) | 2001-143866 |

(51) Int. Cl.[7] .............................................. H03B 5/36
(52) U.S. Cl. ................................ 331/116 FE; 331/158
(58) Field of Search .......................... 331/155, 158, 331/116 FE, 107 R, 108 R, 108 C

(56) References Cited

U.S. PATENT DOCUMENTS

| 4,193,046 A | | 3/1980 | Chiba ........................ 331/109 |
| 5,115,211 A | * | 5/1992 | Hara ...................... 331/116 FE |
| 6,057,742 A | * | 5/2000 | Prado ........................ 331/158 |
| 6,191,662 B1 | * | 2/2001 | Volk ........................... 331/158 |
| 6,320,473 B1 | * | 11/2001 | Leuschner ............ 331/116 FE |

FOREIGN PATENT DOCUMENTS

| JP | S54-023456 | 2/1979 |
| JP | S54-183256 | 12/1979 |
| JP | 54-183256 | 12/1979 |
| JP | S59-075706 | 4/1984 |
| JP | S59-137611 | 9/1984 |
| JP | S59-214305 | 12/1984 |
| JP | S61-287303 | 12/1986 |
| JP | S62-225004 | 10/1987 |
| JP | S62-225006 | 10/1987 |
| JP | H2-113606 | 4/1990 |
| JP | H2-122705 | 5/1990 |
| JP | H2-277317 | 11/1990 |
| JP | H4-070101 | 3/1992 |
| JP | H11-220328 | 8/1999 |
| JP | H11-317623 | 11/1999 |
| JP | 2000-332537 | 11/2000 |
| JP | 2001-185952 | 7/2001 |

* cited by examiner

*Primary Examiner*—Tuan T. Lam
(74) *Attorney, Agent, or Firm*—Koda & Androlia

(57) ABSTRACT

Piezo oscillators having a quick start-up circuit, which applies a start-up quickening voltage to the piezo resonator only for a predetermined length of time after the application of power supply voltage, added to a piezo oscillating circuit. The start-up time taken for the piezo oscillators to reach the steady-estate oscillation from the non-oscillating state can be significantly shortened. The phase noise characteristics and frequency stability characteristics are not affected, since the start-up quickening voltage is removed after the predetermined length of time.

8 Claims, 20 Drawing Sheets

Fig. 7
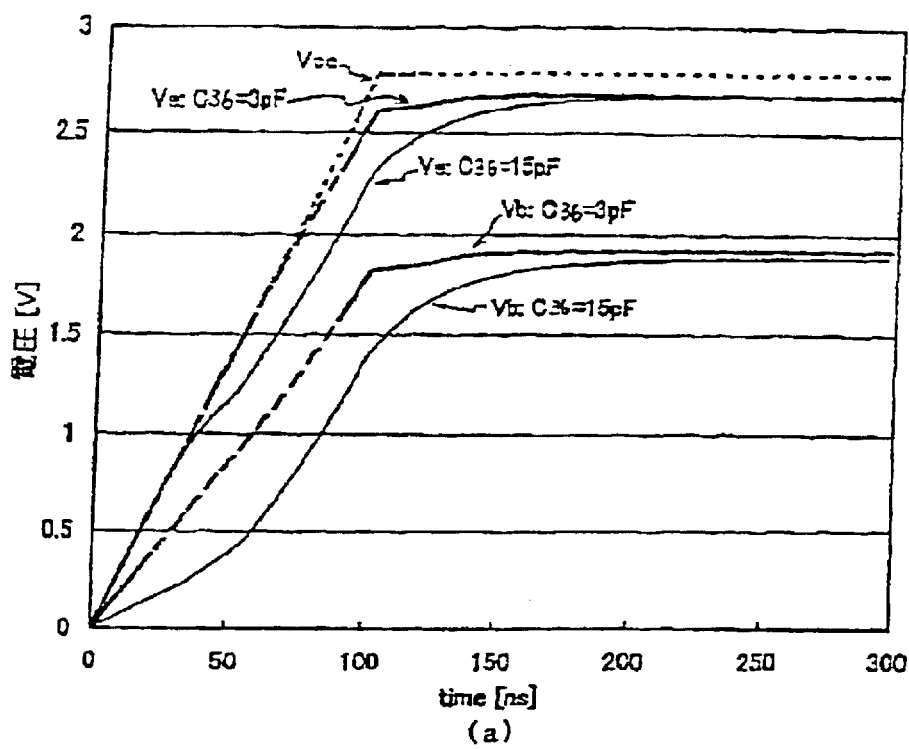
(a)
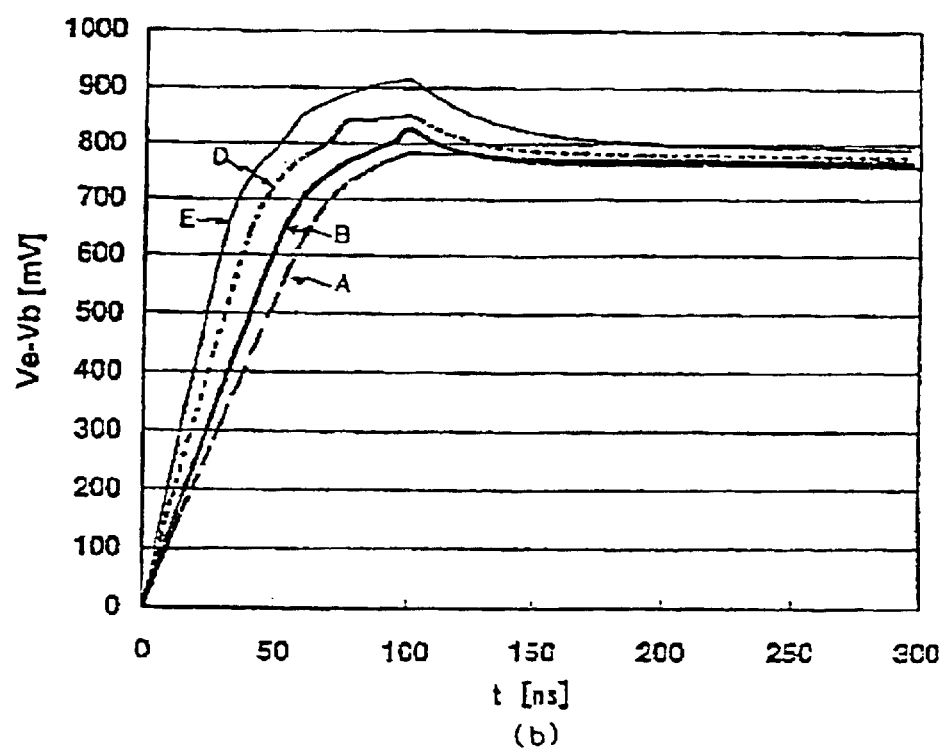
(b)

PIEZOELECTRIC OSCILLATOR

FIELD OF THE INVENTION

The present invention relates to piezo oscillators, and particularly to piezo oscillators with the start-up time taken to reach the steady oscillating state from the non-oscillating state shortened.

BACKGROUND

To make longer continuous use of cell phones possible, the crystal oscillators used as the reference oscillation source in cell phones are intermittently put into operation to reduce power consumption.

For crystal oscillators thus intermittently put into operation, the start-up time taken to generate desired output signals from beginning to be driven is desired to be short. Therefore, the crystal oscillator of the configuration disclosed in the patent application laid open under Laid Open No. 1996-51017 has been put into practical use.

FIG. 38 is a schematic diagram of the conventional crystal oscillator with an improved start-up characteristics, disclosed in the above gazette.

The crystal oscillator 100 shown in the figure is a typical Colpitts crystal oscillator, but characterized in the configuration in which one terminal of the crystal resonator 103 is connected to the base of a transistor 100 through a capacitor 102, and the other terminal of the crystal resonator 103 is connected to the power supply voltage Vcc line. Since the power supply voltage Vcc line is usually connected to the ground through a capacitor 104 of a comparatively large capacitance, the terminal of the crystal oscillator 103 connected to the power supply voltage Vcc line is also connected to the ground via the power supply voltage Vcc line.

Further, in this configuration, resistors 105 and 106 are base-biasing circuit, resistor 107 is an emitter resistor of the transistor 101, and capacitors 108 and 109 serve as part of load capacitance.

By this configuration, a voltage of the same level as the power supply voltage Vcc is applied to the crystal resonator 103 like a pulse wave, and the crystal resonator 103 vibrates in a large level of vibration. As a result, the start-up time taken for the oscillation signal to reach the required level becomes shorter.

However, in the crystal oscillator of the configuration described above, the power supply voltage Vcc line is contained in the oscillation loop, and hence noises contained in the supply voltage and those that come in via the power supply voltage Vcc line are directly applied to the crystal oscillator 103. The phase noise characteristics of this crystal resonator therefore can degrade because of the influence of noises.

Specifically, although the capacitor 104 connected between the power supply voltage Vcc line and the ground serves as a bypass capacitor in the crystal oscillator 100 of the configuration described above, it is not possible to completely remove the noises that comes in from the supply voltage and everywhere on the power supply voltage Vcc line even by using a plurality of bypass capacitors.

Since the noises are amplified by the amplification circuit in the oscillating circuit and output along with the oscillation signal, they can cause the degradation of the phase noise characteristics of the crystal oscillator 100.

If the output signal of such a crystal oscillator is used for digital processing, there is the possibility that bit errors occur in data processing because of the noise signals mixed in the output signal.

Further, when this crystal oscillator is built in apparatuses such as cell phones, the stray capacitance of other circuits connected to the power supply voltage Vcc line comes into the oscillation loop, and causes the problem that the oscillation frequency shifts from the set frequency.

Specifically, in addition to the capacitance of the capacitors and the stray capacitance associated with the circuit elements and wiring patterns of the crystal oscillator, the capacitance of the bypass capacitors connected to the power supply voltage Vcc line and the stray capacitance of circuits in the apparatus in which the crystal oscillator is built in, the oscillation frequency of the crystal oscillator 100 must be set taking into account the capacitance in the apparatus beforehand.

However, this adjustment method can lower the productivity of the apparatuses in which the crystal oscillator is used, since the capacitance of bypass capacitor used in apparatuses differs with models, and hence the adjustment condition must be change accordingly.

The present invention is made to solve these problems with conventional piezo oscillators. The object of the present invention is therefore to provide piezo oscillators having an improved start-up characteristics without degradation in the phase noise characteristics and the frequency stability characteristics.

SUMMARY OF THE INVENTION

The above object is accomplished by the following piezo oscillators.

The piezo oscillator of first embodiment is characterized in that: the piezo oscillator contains a crystal resonator, amplifying circuit, and quick start-up circuit; the quick start-up circuit has a configuration in which an NPN transistor is connected between the power supply voltage Vcc line and one terminal of the crystal resonator in forward polarity, and a capacitor is connected between the power supply voltage Vcc line and the base of the NPN transistor; and a start-up quickening voltage is applied to the piezo resonator from the power supply voltage Vcc line through the NPN transistor for a predetermined length of time after the application of power supply voltage Vcc.

The piezo oscillator of second embodiment is characterized in that: the piezo oscillator contains a piezo resonator, amplifying circuit, and quick start-up circuit; the quick start-up circuit has a configuration in which a first NPN transistor is connected between the power supply voltage Vcc line and one terminal of the piezo resonator in forward polarity, a resistor is connected between the base and the emitter of the first NPN transistor, a second NPN transistor is connected to the power supply voltage Vcc line and the base of the first NPN transistor in forward polarity, and a capacitor is connected between the power supply voltage Vcc line and the base of the second NPN transistor; and a start-up quickening voltage is applied to the piezo resonator from the power supply voltage Vcc line through the NPN transistor for a predetermined length of time after the application of power supply voltage Vcc.

The piezo oscillator of third embodiment is characterized in that: the piezo oscillator contains a piezo resonator, amplifying circuit, and quick start-up circuit; the quick start-up circuit has a configuration in which a PNP transistor is connected between the power supply voltage Vcc line and one terminal of the piezo resonator in forward polarity, and a capacitor and a diode are connected in parallel between the base of the PNP transistor and the ground; and a start-up quickening voltage is applied to the piezo resonator from the power supply voltage Vcc line through the NPN transistor for a predetermined length of time after the application of power supply voltage Vcc.

The piezo oscillator of fourth embodiment is characterized in that: the piezo oscillator contains a piezo resonator, amplifying circuit, and quick start-up circuit for applying a start-up quickening voltage of a desired level to one terminal of the piezo resonator after the application of power supply voltage Vcc; and the quick start-up circuit begins to operate with a delay determined according to the rise of voltage of the power supply voltage Vcc after the application of the power supply voltage Vcc and outputs the start-up quickening voltage with a steeper rise than the rise characteristics of the power supply voltage Vcc.

The piezo oscillator of fifth embodiment is characterized in that: the piezo resonator, amplifying circuit, and quick start-up circuit for applying a start-up quickening voltage of a desired level to one terminal of the piezo resonator after the application of power supply voltage Vcc; the quick start-up circuit having a transistor switch and a voltage dividing circuit for base biasing of the transistor switch; and the quick start-up circuit begins to operate at the timing controlled by the voltage division ratio of the voltage dividing circuit after the application of the power supply voltage Vcc and outputs a start-up quickening voltage with a steeper rise than the rise characteristics of the power supply voltage Vcc.

The piezo oscillator of sixth embodiment is characterized in that: the piezo oscillator contains a piezo resonator, amplifying circuit, and quick start-up circuit for applying a start-up quickening voltage of a desired level to one terminal of the piezo resonator after the application of power supply voltage Vcc; the quick start-up circuit having a configuration in which a PNP transistor switch is connected between the oscillation loop of the piezo oscillator and the power supply voltage Vcc line with the collector and emitter in forward polarity, a first capacitor is connected between the base of the transistor and the power supply voltage Vcc line, and a second capacitor is connected between the base of the transistor and the ground; and the quick start-up circuit begins to operate with a delay determined according to the rise of the power supply voltage Vcc after the application of power supply voltage Vcc and outputs a start-up quickening voltage with a steeper rise than the rise characteristics of the power supply voltage Vcc.

The piezo oscillator of seventh embodiment is characterized in that: the piezo oscillator contains a piezo resonator, amplifying circuit, and quick start-up circuit for applying a start-up quickening voltage of a desired level to one terminal of the piezo resonator after the application of power supply voltage Vcc; the quick start-up circuit has a configuration in which a PNP transistor switch is connected between the oscillation loop of the piezo oscillator and the power supply voltage Vcc line with the collector and emitter in forward polarity, a first capacitor is connected between the base of the transistor and the power supply voltage Vcc line, and a second capacitor is connected between the base of the transistor and the ground; and the quick start-up circuit begins to operate at the timing controlled by the voltage division ratio of the voltage dividing circuit after the application of the power supply voltage Vcc and outputs a start-up quickening voltage with a steeper rise than the rise characteristics of the power supply voltage Vcc.

The piezo oscillator of eighth embodiment is characterized in that: the piezo oscillator contains a piezo resonator, amplifying circuit, and quick start-up circuit for applying a start-up quickening voltage of a desired level to one terminal of the piezo resonator after the application of power supply voltage Vcc; the quick start-up circuit has a first transistor switch, a voltage dividing circuit for base biasing of the first transistor switch, and a second transistor switch which is turned ON and OFF by the output current of the first transistor switch; and the quick start-up circuit begins to operate at the timing controlled by the voltage division ratio of the voltage dividing circuit after the application of the power supply voltage Vcc and outputs a start-up quickening voltage with a steeper rise than the rise characteristics of the power supply voltage Vcc.

The piezo oscillator of ninth embodiment is characterized in that: the piezo oscillator contains a piezo resonator, amplifying circuit, and quick start-up circuit for applying a start-up quickening voltage of a desired level to one terminal of the piezo resonator after the application of power supply voltage Vcc; the quick start-up circuit has a first PNP transistor switch connected between the oscillation loop of the piezo oscillator and the power supply voltage Vcc line with the collector and emitter in forward polarity, a first capacitor connected between the base of the first PNP transistor and the power supply voltage Vcc line, a second capacitor connected between the base of the first PNP transistor and the ground, and a second transistor switch which is turned ON and OFF by the output current of the first PNP transistor switch; and the quick start-up circuit begins to operate with a delay according to the rise of the power supply voltage Vcc after the application of the power supply voltage Vcc and outputs a start-up quickening voltage with a steeper rise than the rise characteristics of the power supply voltage Vcc.

The piezo oscillator of tenth embodiment is characterized in that: the piezo oscillator contains a piezo resonator, amplifying circuit, and quick start-up circuit for applying a start-up quickening voltage of a desired level to one terminal of the piezo resonator after the application of power supply voltage Vcc; the quick start-up circuit has a first PNP transistor switch connected between the oscillation loop of the piezo oscillator and the power supply voltage Vcc line with the collector and emitter in forward polarity, a first capacitor connected between the base of the first PNP transistor and the power supply voltage Vcc line, a second capacitor connected between the base of the first PNP transistor and the ground, and a second transistor switch which is turned ON and OFF by the output current of the first PNP transistor switch; and the quick start-up circuit begins to operate at the timing controlled by the capacitance ratio of the first and second capacitors after the application of the power supply voltage Vcc and outputs a start-up quickening voltage with a steeper rise than the rise characteristics of the power supply voltage Vcc.

The piezo oscillator of eleventh embodiment is characterized in that: the oscillating circuit contains a piezo resonator, amplifying circuit, and quick start-up circuit for applying a start-up quickening voltage of a desired level to one terminal of the piezo resonator after the application of power supply voltage Vcc; the quick start-up circuit has a first PNP transistor switch connected between the oscillation loop of the piezo oscillator and the power supply voltage Vcc line with the collector and emitter in forward polarity, a first capacitor connected between the base of the first PNP transistor and the power supply voltage Vcc line, and a second capacitor connected between the base of the first PNP transistor and the ground; the quick start-up circuit begins to operate with a delay according to the rise of the power supply voltage Vcc after the application of the power supply voltage Vcc and outputs a start-up quickening voltage with a steeper rise than the rise characteristics of the power supply voltage Vcc; and the quick start-up circuit further has a transistor switch which turns ON at about the same time as the turning-ON of the first PNP transistor between the base of the first PNP transistor and the ground.

The piezo oscillator of twelfth embodiment is characterized in that: the oscillating circuit contains a piezo resonator, amplifying circuit, and quick start-up circuit for applying a start-up quickening voltage of a desired level to one terminal of the piezo resonator after the application of power supply voltage Vcc; the quick start-up circuit has a first PNP transistor switch connected between the oscillation loop of the piezo oscillator and the power supply voltage Vcc line with the collector and emitter in forward polarity, a first capacitor connected between the base of the first PNP transistor and the power supply voltage Vcc line, and a second capacitor connected between the base of the first PNP transistor and the ground; the quick start-up circuit begins to operate with a delay according to the rise of the power supply voltage Vcc after the application of the power supply voltage Vcc and outputs a start-up quickening voltage with a steeper rise than the rise characteristics of the power supply voltage Vcc; and the quick start-up circuit has a PNP transistor which turns ON at about the same time at the timing of the turning-ON of the first PNP transistor between the base of the first PNP transistor and the ground; the quick start-up circuit begins to operate at the timing controlled by the capacitance ratio of the first and second capacitors after the application of the power supply voltage Vcc and outputs a start-up quickening voltage with a steeper rise than the rise characteristics of the power supply voltage Vcc; and the quick start-up circuit further has a transistor switch which turns ON at about the same time as the turning-ON of the first PNP transistor between the base of the first PNP transistor and the ground.

The piezo oscillator of thirteenth embodiment is characterized in that: the oscillating circuit contains a piezo resonator, amplifying circuit, and quick start-up circuit for applying a start-up quickening voltage of a desired level to one terminal of the piezo resonator after the application of power supply voltage Vcc; the quick start-up circuit has a first PNP transistor switch connected between the oscillation loop of the piezo oscillator and the power supply voltage Vcc line with the collector and emitter in forward polarity, a first capacitor connected between the base of the first PNP transistor and the power supply voltage Vcc line, a second capacitor connected between the base of the first PNP transistor and the ground, and a second transistor switch which is turned ON and OFF by the output current of the first PNP transistor switch; the quick start-up circuit begins to operate with a delay according to the rise of the power supply voltage Vcc after the application of the power supply voltage Vcc and outputs a start-up quickening voltage with a steeper rise than the rise characteristics of the power supply voltage Vcc; and the quick start-up circuit further has a transistor switch which turns ON at about the same time as the turning-ON of the first PNP transistor between the base of the first PNP transistor and the ground.

The piezo oscillator of fourteenth embodiment is characterized in that: the oscillating circuit contains a piezo resonator, amplifying circuit, and quick start-up circuit for applying a start-up quickening voltage of a desired level to one terminal of the piezo resonator after the application of power supply voltage Vcc; the quick start-up circuit has a first PNP transistor switch connected between the oscillation loop of the piezo oscillator and the power supply voltage Vcc line with the collector and emitter in forward polarity, a first capacitor connected between the base of the first PNP transistor and the power supply voltage Vcc line, a second capacitor connected between the base of the first PNP transistor and the ground, and a second transistor switch which is turned ON and OFF by the output current of the first PNP transistor switch; the quick start-up circuit begins to operate at the timing controlled by the capacitance ratio of the first and second capacitors after the application of the power supply voltage Vcc and outputs a start-up quickening voltage with a steeper rise than the rise characteristics of the power supply voltage Vcc; and the quick start-up circuit further has a transistor switch which turns ON at about the same time as the turning-ON of the first PNP transistor between the base of the first PNP transistor and the ground.

The piezo oscillator of fifteenth embodiment is characterized in that: the piezo oscillator contains a piezo resonator, amplifying circuit, and quick start-up circuit for applying a start-up quickening voltage of a desired level to one terminal of the piezo resonator after the application of power supply voltage Vcc; the quick start-up circuit has a transistor switch and a voltage dividing circuit for base biasing of the transistor switch which has a series circuit of a capacitor and a resistor; and the quick start-up circuit begins to operate at the timing controlled by the time constant of the series circuit and outputs a start-up quickening voltage with a steeper rise than the rise characteristics of the power supply voltage Vcc.

The piezo oscillator of sixteenth embodiment is characterized in that: the piezo oscillator contains a piezo resonator, oscillating transistor, and quick start-up circuit; and the quick start-up circuit functions to increase the collector current of the oscillating transistor for a predetermined length of time after the application of power supply voltage Vcc in order to shorten the start-up time of the crystal oscillating circuit and stops functioning after the predetermined length of time.

The piezo oscillator of seventeenth embodiment is characterized in that: the piezo oscillator contains a piezo resonator, oscillating transistor, emitter resistor of the oscillating transistor connected between the emitter of the oscillating transistor and the ground, and quick start-up circuit; and the quick start-up circuit functions to decrease the impedance across the emitter resistor for a predetermined length of time after the application of power supply voltage Vcc in order to shorten the start-up time of the piezo oscillator.

The piezo oscillator of eighteenth embodiment is characterized in that: the piezo oscillator contains a piezo resonator, oscillating transistor, emitter resistor of the oscillating transistor connected between the emitter of the oscillating transistor and the ground, and quick start-up circuit; and the quick start-up circuit contains a switch circuit and connects both ends of the emitter resistor by the switch circuit for a predetermined length of time after the application of power supply voltage Vcc to decrease the resistance between the emitter of the oscillating transistor and the ground and shorten the start-up time of the piezo oscillator.

The piezo oscillator of nineteenth embodiment is characterized in that: the piezo oscillator contains a piezo resonator, oscillating transistor, emitter resistor of the oscillating transistor connected between the emitter of the oscillating transistor and the ground, and quick start-up circuit; and the quick start-up circuit contains a switch circuit and a switch control circuit, and the switch control circuit controls the ON and OFF operation of the switch circuit according to the charging current of a capacitor to short-circuit both ends of the emitter resistor by the switch circuit for a predetermined length of time after the application of power supply voltage Vcc and thereby decrease the resistance between the emitter of the oscillating transistor and the ground and shorten the start-up time of the piezo oscillator.

The piezo oscillator of twentieth embodiment is characterized in that: the piezo oscillator contains a piezo resonator, oscillating transistor, emitter resistor of the oscillating transistor connected between the emitter of the oscillating transistor and the ground, and quick start-up circuit; the quick start-up circuit contains a switch circuit and a switch control circuit; the switch circuit contains a second transistor whose collector is connected to the emitter of the oscillating transistor and whose emitter is connected to the ground; the switch control circuit contains a third transistor whose collector is connected to the power supply voltage Vcc line, whose base is connected to the power supply voltage Vcc line through a capacitor, and whose emitter is connected to the base of the second transistor through a resistor; and the ON and OFF operation of the switch circuit is controlled by the charging current of the capacitor so as to short-circuit both ends of the emitter resistor for a predetermined length of time after the application of the power supply voltage Vcc and thereby decrease the resistance between the emitter of the oscillating transistor and the ground and shorten the start-up time of the piezo oscillator.

The piezo oscillator of twenty first embodiment is characterized in that: the piezo oscillator contains a piezo resonator, oscillating transistor, emitter resistor of the oscillating transistor connected between the emitter of the oscillating transistor and the ground, and quick start-up circuit; the quick start-up circuit contains a switch circuit and a switch control circuit; the switch circuit contains a second transistor whose collector is connected to the emitter of the oscillating transistor through a resistor and whose emitter is connected to the ground; the switch control circuit contains a third transistor whose collector is connected to the power supply voltage Vcc line, whose base is connected to the power supply voltage Vcc line through a capacitor, and whose emitter is connected to the base of the second transistor through a resistor; and the ON and OFF operation of the switch circuit is controlled by the charging current of the capacitor so as to short-circuit both ends of the emitter resistor for a predetermined length of time after the application of the power supply voltage Vcc and thereby decrease the resistance between the emitter of the oscillating transistor and the ground and shorten the start-up time of the piezo oscillator.

The piezo oscillator of twenty second embodiment is characterized in that: the piezo oscillator contains a piezo resonator, oscillating transistor, and quick start-up circuit; and the quick start-up circuit functions to pull up the voltage of the collector of the oscillating transistor for a predetermined length of time after the application of power supply voltage Vcc and thereby increase the collector current and shorten the start-up time of the piezo oscillator, and stops functioning after the predetermined length of time.

The piezo oscillator of twenty third embodiment is characterized in that: the piezo oscillator contains a piezo resonator, oscillating transistor, second transistor connected to the oscillating transistor in cascade, collector resistor of the second transistor connected between the collector of the second transistor and the power supply voltage Vcc line, and quick start-up circuit; the quick start-up circuit functions to pull up the collector voltage of the second transistor for a predetermined length of time after the application of power supply voltage Vcc; and the resulting rise in the collector voltage of the oscillating transistor causes an increase in the collector current of the oscillating transistor which makes the piezo resonator begin to vibrate forcibly and thereby shortens the start-up time of the piezo oscillator.

The piezo oscillator of twenty fourth embodiment is characterized in that: the piezo oscillator contains a piezo resonator, oscillating transistor, second transistor connected to the oscillating transistor in cascade, collector resistor of the second transistor connected between the collector of the second transistor and the power supply voltage Vcc line, and quick start-up circuit; the quick start-up circuit contains a switch circuit; the switch circuit turns ON for a predetermined length of time after the application of power supply voltage Vcc to connect the collector of the oscillating transistor or the collector of the second transistor to the power supply voltage Vcc line with a small resistance; and the resulting rise in the collector voltage of the oscillating transistor causes an increase in the collector current of the oscillating transistor which makes the piezo resonator begin to vibrate forcibly and thereby shortens the start-up time of the piezo oscillator.

The piezo oscillator of twenty fifth embodiment is characterized in that: the piezo oscillator contains a piezo resonator, oscillating transistor, second transistor connected to the oscillating transistor in cascade, collector resistor of the second transistor connected between the collector of the second transistor and the power supply voltage Vcc line, and quick start-up circuit; the quick start-up circuit contains a switch circuit and a switch control circuit; the switch control circuit contains a capacitor and is activated by the charging current of the capacitor for a predetermined length of time after the application of power supply voltage Vcc to turn the switch circuit ON; the switch circuit, while it is ON, connects the collector of the oscillating transistor or the collector of the second transistor to the power supply voltage Vcc line with a small resistance; and the resulting rise in the collector voltage of the oscillating transistor causes an increase in the collector current of the oscillating transistor which makes the piezo resonator begin to vibrate forcibly and thereby shortens the start-up time of the piezo oscillator.

The piezo oscillator of twenty sixth embodiment is characterized in that: the piezo oscillator contains a piezo resonator, oscillating transistor, second transistor connected to the oscillating transistor in cascade, collector resistor of the second transistor connected between the collector of the second transistor and the power supply voltage Vcc line, and quick start-up circuit; the quick start-up circuit contains a switch circuit and a switch control circuit; the switch circuit has a configuration in which the emitter of a PNP transistor is connected to the power supply voltage Vcc line, the collector of the PNP transistor is connected to the collector of the oscillating transistor or to the collector of the second transistor; the switch control circuit has a configuration in which the collector of a third transistor is connected to the base of the PNP transistor, the base of the third transistor is connected to the power supply voltage Vcc line through a capacitor and to the ground through a diode in reverse polarity, and the emitter of the third transistor is connected to the ground through a resistor; the switch control circuit is activated by the charging current of the capacitor for a predetermined length of time after the application of power supply voltage Vcc to turn the switch circuit ON; the switch circuit, while it is ON, connects the collector of the oscillating transistor or the collector of the second transistor to the power supply voltage Vcc line with a small resistance;

and the resulting rise in the collector voltage of the oscillating transistor causes an increase in the collector current of the oscillating transistor which makes the piezo resonator begin to vibrate forcibly and thereby shortens the start-up time of the piezo oscillator.

The piezo oscillator of twenty seventh embodiment is characterized in that: the piezo oscillator contains a piezo resonator, oscillating transistor, second transistor connected to the oscillating transistor in cascade, collector resistor of the second transistor connected between the collector of the second transistor and the power supply voltage Vcc line, and quick start-up circuit; the quick start-up circuit contains a switch circuit and a switch control circuit; the switch circuit has a configuration in which the emitter of a PNP transistor is connected to the power supply voltage Vcc line, the collector of the PNP transistor is connected to the collector of the oscillating transistor or the collector of the second transistor; the switch control circuit has a configuration in which the collector of a third transistor is connected to the base of the PNP transistor and to the power supply voltage Vcc line through a resistor, the base of the third transistor is connected to the power supply voltage Vcc line through a capacitor and to the ground through a diode in reverse polarity, and the emitter of the third transistor is connected to the ground through a resistor; the switch control circuit is activated by the charging current of the capacitor for a predetermined length of time after the application of power supply voltage Vcc to turn the switch circuit ON; the switch circuit, while it is ON, connects the collector of the oscillating transistor or the collector of the second transistor to the power supply voltage Vcc line with a small resistance; and the resulting rise in the collector voltage of the oscillating transistor causes an increase in the collector current of the oscillating transistor which makes the piezo resonator begin to vibrate forcibly and thereby shortens the start-up time of the piezo oscillator.

The piezo oscillator of twenty eighth embodiment is characterized in that: the piezo oscillator contains a piezo resonator, oscillating transistor, emitter resistor and collector resistor of the oscillating transistor, and quick start-up circuit; the quick start-up circuit functions to connect the emitter of the oscillating transistor to the ground with a small resistance and connect the collector of the oscillating transistor to the power supply voltage Vcc line for a predetermined length of time after the application of the power supply voltage Vcc, and the resulting increase in the collector current of the oscillating transistor shortens the start-up time of the piezo oscillator; and the quick start-up circuit stops functioning after the predetermined length of time, and the collector current of the oscillating transistor decreases to the normal value.

The piezo oscillator of twenty ninth embodiment is characterized in that: the piezo oscillator contains a piezo resonator, oscillating transistor, emitter resistor of the oscillating transistor, second transistor connected to the oscillating transistor in cascade, collector resistor of the second transistor, and quick start-up circuit; the quick start-up circuit functions to connect the emitter of the oscillating transistor to the ground with a small resistance and connect the collector of the oscillating transistor or of the second transistor to the power supply voltage Vcc line with a small resistance for a predetermined length of time after the application of the power supply voltage Vcc, which causes an increase in the collector current of the oscillating transistor and thereby shortens the start-up time of the piezo oscillator; and the quick start-up circuit stops functioning after the predetermined length of time to let the collector current of the oscillating transistor decrease to the normal value.

The piezo oscillator of thirtieth embodiment is characterized in that: the piezo oscillator contains a piezo resonator, oscillating transistor, emitter resistor and collector resistor of the oscillating transistor, and quick start-up circuit; the quick start-up circuit has at least two switch circuits: one switch circuit connects the emitter of the oscillating transistor to the ground with a small resistance, and the other switch circuit connects the collector of the oscillating transistor to the power supply voltage Vcc line with a small resistance; the switch circuits of the quick start-up circuit are turned ON for a predetermined length of time after the application of power supply voltage Vcc, and the resulting increase in the collector current of the oscillating transistor shortens the start-up time of the piezo oscillator; and the switch circuits of the quick start-up circuit are turned off after the predetermined length of time, and the collector current of the oscillating transistor decreases to the normal value.

The piezo oscillator of thirty first embodiment is characterized in that: the piezo oscillator contains a piezo resonator, oscillating transistor, emitter resistor of the oscillating transistor, second transistor connected to the oscillating transistor in cascade, collector resistor of the second transistor, and quick start-up circuit; the quick start-up circuit has at least two switch circuits: one switch circuit connects the emitter of the oscillating transistor to the ground with a small resistance, and the other switch circuit connects the collector of the oscillating transistor or of the second transistor to the power supply voltage Vcc line with a small resistance; the switch circuits of the quick start-up circuit are turned ON for a predetermined length of time after the application of power supply voltage Vcc, and the resulting increase in the collector current of the oscillating transistor shortens the start-up time of the piezo oscillator; and the switch circuits of the quick start-up circuit are turned off after the predetermined length of time to let the collector current of the oscillating transistor decrease to the normal value.

The piezo oscillator of thirty second embodiment is characterized in that: the piezo oscillator contains a piezo resonator, oscillating transistor, emitter resistor and collector resistor of the oscillating transistor, and quick start-up circuit; the quick start-up circuit has at least two switch circuits and a switch control circuit; the switch control circuit contains a capacitor and is activated to turn the switching circuits ON by the charging current of the capacitor for a predetermined length of time after the application of power supply voltage Vcc; when being ON, one of the switch circuits connects the emitter of the oscillating transistor to the ground with a small resistance, and the other switch circuit connects the collector of the oscillating transistor to the power supply voltage Vcc line with a small resistance, which causes an increase in the collector current of the oscillating transistor and thereby shortens the start-up time of the piezo oscillator; and the switch circuits are turned off after the predetermined length of time to let the collector current of the oscillating transistor decrease to the normal value.

The piezo oscillator of thirty third embodiment is characterized in that: the piezo oscillator contains a piezo resonator, oscillating transistor, emitter resistor of the oscillating transistor, second transistor connected to the oscillating transistor in cascade, collector resistor of the second transistor, and quick start-up circuit; the quick start-up circuit has at least two switch circuits and a switch control circuit; the switch control circuit contains a capacitor and is activated to turn the switching circuits ON by the charging current of the capacitor for a predetermined length of time after the application of power supply voltage Vcc; when being ON, one of the switch circuits connects the emitter of the oscillating transistor to the ground with a small resistance, and the other switch circuit connects the collector of the oscillating transistor or of the second transistor to the power supply voltage Vcc line with a small resistance, which causes an increase in the collector current of the oscillating transistor and thereby shortens the start-up time of the piezo oscillator; and the switch circuits are turned off after the predetermined length of time to let the collector current of the oscillating transistor decrease to the normal value.

The piezo oscillator of thirty fourth embodiment is characterized in that: the piezo oscillator contains a piezo resonator, oscillating transistor, emitter resistor and collector resistor of the oscillating transistor, and quick start-up circuit; the quick start-up circuit has at least two switch circuits and a switch control circuit; one of the switch circuits has a configuration in which the collector of a second transistor is connected to the emitter of the oscillating transistor and the emitter of the second transistor is connected to the ground; the other switch circuit has a configuration in which the emitter of a PNP transistor is connected to the power supply voltage Vcc line and the collector of the PNP transistor is connected to the collector of the oscillating transistor; the switch control circuit has a configuration in which the emitter of a third transistor is connected to the base of the second transistor through a resistor, the collector of the third transistor is connected to the base of the PNP transistor, and the base of the third transistor is connected to the power supply voltage Vcc line through a capacitor and to the ground through a diode in reverse polarity; the switch control circuit is activated by the charging current of the capacitor for a predetermined length of time after the application of power supply voltage Vcc to turn the switch circuits ON; the switch circuits, when being ON, connect the emitter of the oscillating transistor to the ground with a small resistance and connect the collector of the oscillating transistor to the power supply voltage Vcc line with a small resistance; and the switch circuits are turned off by the switch control circuit after the predetermined length of time to let the collector current of the oscillating transistor decrease to the normal value.

The piezo oscillator of thirty fifth embodiment is characterized in that: the piezo oscillator contains a piezo resonator, oscillating transistor, emitter resistor of the oscillating transistor, second transistor connected to the oscillating transistor in cascade, collector resistor of the second transistor, and quick start-up circuit; the quick start-up circuit has at least two switch circuits and a switch control circuit; one of the switch circuits has a configuration in which the collector of a third transistor is connected to the emitter of the oscillating transistor and the emitter of the third transistor is connected to the ground; the other switch circuit has a configuration in which the emitter of a PNP transistor is connected to the power supply voltage Vcc line and the collector of the PNP transistor is connected to the collector of the oscillating transistor or the collector of the second transistor; the switch control circuit has a configuration in which the emitter of a fourth transistor is connected to the base of the third transistor through a resistor, the collector of the fourth transistor is connected to the base of the PNP transistor, and the base of the fourth transistor is connected to the power supply voltage Vcc line through a capacitor and to the ground through a diode in reverse polarity; the switch control circuit is activated by the charging current of the capacitor for a predetermined length of time after the application of power supply voltage Vcc to turn the switch circuits ON; the switch circuits, when being ON, connect the emitter of the oscillating transistor to the ground with a small resistance and connect the collector of the oscillating transistor or of the second transistor to the power supply voltage Vcc line with a small resistance; and the switch circuits are turned off by the switch control circuit after the predetermined length of time to let the collector current of the oscillating transistor decrease to the normal value.

The piezo oscillator of thirty sixth embodiment is characterized in that: the piezo oscillator contains a piezo resonator, oscillating transistor, emitter resistor and collector resistor of the oscillating transistor, and quick start-up circuit; the quick start-up circuit has at least two switch circuits and a switch control circuit; one of the switch circuits has a configuration in which the collector of a second transistor is connected to the emitter of the oscillating transistor and the emitter of the second transistor is connected to the ground; the other switch circuit has a configuration in which the emitter of a PNP transistor is connected to the power supply voltage Vcc line and the collector of the PNP transistor is connected to the collector of the oscillating transistor; the switch control circuit has a configuration in which the emitter of a third transistor is connected to the base of the second transistor through a resistor, the collector of the third transistor is connected to the base of the PNP transistor and to the power supply voltage Vcc line through a resistor, and the base of the third transistor is connected to the power supply voltage Vcc line through a capacitor and to the ground through a diode in reverse polarity; the switch control circuit is activated by the charging current of the capacitor for a predetermined length of time after the application of power supply voltage Vcc to turn the switch circuits ON; the switch circuits, when being ON, connect the emitter of the oscillating transistor to the ground with a small resistance and connect the collector of the oscillating transistor to the power supply voltage Vcc line with a small resistance; and the switch circuits are turned off by the switch control circuit after the predetermined length of time to let the collector current of the oscillating transistor decrease to the normal value.

The piezo oscillator of thirty seventh embodiment is characterized in that: the piezo oscillator contains a piezo resonator, oscillating transistor, emitter resistor of the oscillating transistor, second transistor connected to the oscillating transistor in cascade, collector resistor of the second transistor, and quick start-up circuit; the quick start-up circuit has at least two switch circuits and a switch control circuit; one of the switch circuits has a configuration in which the collector of a third transistor is connected to the emitter of the oscillating transistor and the emitter of the third transistor is connected to the ground; the other switch circuit has a configuration in which the emitter of a PNP transistor is connected to the power supply voltage Vcc line and the collector of the PNP transistor is connected to the collector of the oscillating transistor or the collector of the second transistor; the switch control circuit has a configuration in which the emitter of a fourth transistor is connected to the base of the third transistor through a resistor, the collector of the fourth transistor is connected to the base of the PNP transistor and to the power supply voltage Vcc line through a resistor, and the base of the fourth transistor is connected to the power supply voltage Vcc line through a capacitor and to the ground through a diode in reverse polarity; the switch control circuit is activated by the charging current of the capacitor for a predetermined length of time after the application of power supply voltage Vcc to turn the switch circuits ON; the switch circuits, when being ON, connect the emitter of the oscillating transistor to the ground with a small resistance and connect the collector of the oscillating transistor or of the second transistor to the power supply voltage Vcc line with a small resistance; and the switch circuits are turned off by the switch control circuit after the predetermined length of time to let the collector current of the oscillating transistor decrease to the normal value.

The piezo oscillator of thirty eighth embodiment is characterized in that: the piezo oscillator contains a piezo resonator, oscillating transistor, emitter resistor and collector resistor of the oscillating transistor, and quick start-up circuit; the quick start-up circuit has at least two switch circuits and a switch control circuit; one of the switch circuits has a configuration in which the collector of a second transistor is connected to the emitter of the oscillating transistor through a resistor and the emitter of the second transistor is connected to the ground; the other switch circuit has a configuration in which the emitter of a PNP transistor is connected to the power supply voltage Vcc line and the collector of the PNP transistor is connected to the collector of the oscillating transistor; the switch control circuit has a configuration in which the emitter of a third transistor is connected to the base of the second transistor through a resistor, the collector of the third transistor is connected to the base of the PNP transistor and to the power supply voltage Vcc line through a resistor, and the base of the third transistor is connected to the power supply voltage Vcc line through a capacitor and to the ground through a diode in reverse polarity; the switch control circuit is activated by the charging current of the capacitor for a predetermined length of time after the application of power supply voltage Vcc to turn the switch circuits ON; the switch circuits, when being ON, connect the emitter of the oscillating transistor to the ground with a small resistance and connect the collector of the oscillating transistor to the power supply voltage Vcc line with a small resistance; and the switch circuits are turned off by the switch control circuit after the predetermined length of time to let the collector current of the oscillating transistor decrease to the normal value.

The piezo oscillator of thirty ninth embodiment is characterized in that: the piezo oscillator contains a piezo resonator, oscillating transistor, emitter resistor of the oscillating transistor, second transistor connected to the oscillating transistor in cascade, collector resistor of the second transistor, and quick start-up circuit; the quick start-up circuit has at least two switch circuits and a switch control circuit; one of the switch circuits has a configuration in which the collector of a third transistor is connected to the emitter of the oscillating transistor through a resistor and the emitter of the third transistor is connected to the ground; the other switch circuit has a configuration in which the emitter of a PNP transistor is connected to the power supply voltage Vcc line and the collector of the PNP transistor is connected to the collector of the oscillating transistor or the collector of the second transistor; the switch control circuit has a configuration in which the emitter of a fourth transistor is connected to the base of the third transistor through a resistor, the collector of the fourth transistor is connected to the base of the PNP transistor and to the power supply voltage Vcc line through a resistor, and the base of the fourth transistor is connected to the power supply voltage Vcc line through a capacitor and to the ground through a diode in reverse polarity; the switch control circuit is activated by the charging current of the capacitor for a predetermined length of time after the application of power supply voltage Vcc to turn the switch circuits ON; the switch circuits, when being ON, connect the emitter of the oscillating transistor to the ground with a small resistance and connect the collector of the oscillating transistor or of the second transistor to the power supply voltage Vcc line with a small resistance; and the switch circuits are turned off by the switch control circuit after the predetermined length of time to let the collector current of the oscillating transistor decrease to the normal value.

The piezo oscillator of fortieth embodiment is characterized in that: the piezo oscillator contains a piezo resonator, oscillating transistor, and quick start-up circuit; and the quick start-up circuit controls the collector current and the emitter current of the oscillating transistor by means of current regulating circuits in a current mirror configuration only for a predetermined length of time after the application of the power supply voltage Vcc.

The piezo oscillator of forty first embodiment is characterized in that: the piezo oscillator contains a piezo resonator, oscillating transistor, and two quick start-up circuits; a first quick start-up circuit applies a start-up quickening voltage to the piezo resonator only for a predetermined length of time after the application of the power supply voltage Vcc; and a second quick start-up circuit increases the collector current of the oscillating transistor only for a predetermined length of time after the application of the power supply voltage Vcc.

The piezo oscillator of forty second embodiment is characterized in that: the piezo oscillator contains a piezo resonator, oscillating transistor, and two quick start-up circuits; the quick start-up circuits each have one or more switch circuits; a first quick start-up circuit applies the power supply voltage Vcc to the piezo resonator as a start-up quickening voltage through the switch circuit only for a predetermined length of time after the application of the power supply voltage Vcc; and a second quick start-up circuit bypasses the emitter resistor, the collector resistor, or both of the oscillating transistor through the switch circuit or switch circuits to increase the collector current of the oscillating transistor only for a predetermined length of time after the application of the power supply voltage Vcc.

The piezo oscillator of forty third embodiment is characterized in that: the piezo oscillator contains a piezo resonator, oscillating transistor, buffer transistor connected to the oscillating transistor in cascade; the base of the buffer transistor is connected to the power supply voltage Vcc line through a first capacitor; and the base of the buffer transistor is connected to the ground through a second capacitor.

The piezo oscillator of forty fourth embodiment is characterized in that: the piezo oscillator contains a piezo resonator, oscillating transistor, emitter resistor of the oscillating transistor, and quick start-up circuit; the quick start-up circuit has a switch circuit using a depletion type p-channel FET for the switch device; the switch circuit turns ON only for a predetermined length of time after the application of power supply voltage Vcc to connect both ends of the emitter resistor and thereby increase the start-up current to the piezo resonator; and the switch circuit turns OFF after the predetermined length of time.

The piezo oscillator of forty fifth embodiment is characterized in that: the piezo oscillator contains a piezo resonator, oscillating transistor, emitter resistor of the oscillating transistor, and quick start-up circuit; the quick start-up circuit has a configuration in which the base of a depletion type p-channel FET is connected to the power supply voltage Vcc line, the gate of the depletion type p-channel FET is connected to between a resistor and a capacitor connected in series between the power supply voltage Vcc line and the ground, and the source to drain of the depletion type p-channel FET is connected in parallel with the emitter resistor of the oscillating transistor; the depletion type p-channel FET turns ON only for a predetermined length of time after the application of power supply voltage Vcc to connect both ends of the emitter resistor and thereby increase the start-up current to the piezo resonator; and the depletion type p-channel FET turns OFF after the predetermined length of time.

BRIEF DESCRIPTION OF THE DRAWINGS

FIG. 7(a) is a graph that shows the rise characteristics of the emitter voltage and the base voltage of the transistor 33 of the crystal oscillator in FIG. 5 for different capacitance ratios.

FIG. 7(b) is a graph that shows the rise characteristics of the emitter-base voltage of the transistor 33 of the crystal oscillator in FIG. 5.

FIG. 22 is a schematic diagram of an embodiment of the crystal oscillator according to the present invention.

FIG. 23 is a schematic diagram of an embodiment of the crystal oscillator according to the present invention.

DETAILED DESCRIPTION OF PREFERRED EMBODIMENTS

Figure 1:
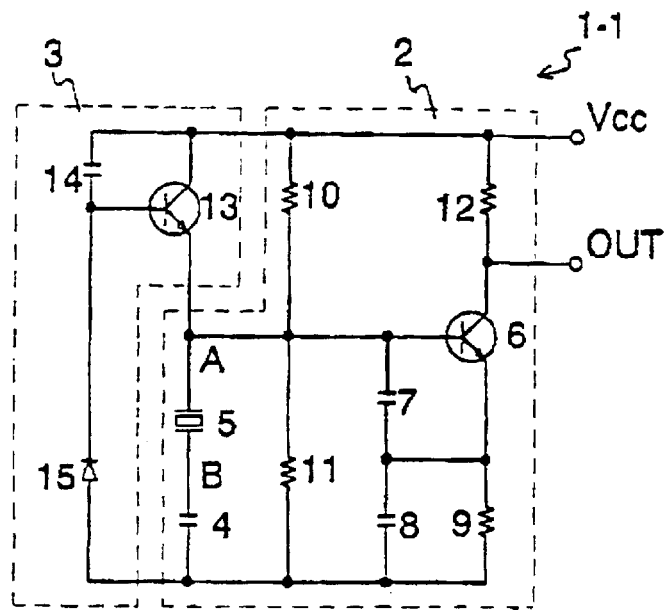
FIG. 1 is a schematic diagram of an embodiment of the crystal oscillator according to the present invention.

FIG. 1 is a schematic diagram that shows an embodiment of the crystal oscillator according to the present invention.

The crystal oscillator 1—1 shown in FIG. 1 consists of a crystal oscillating circuit 2 encircled by a dashed line and a quick start-up circuit 3 enclosed by a one-dot chain line.

The crystal oscillating circuit 2 is a typical Colpitts crystal oscillating circuit having a configuration in which a crystal resonator 5 is connected to the base of the oscillating transistor 6 with the other terminal connected to the ground through a capacitor 4, capacitors 7 and 8 that are connected in series and constitute part of the load capacitance are connected between the base and the ground, a point between the capacitors 7 and 8 is connected to the emitter of the transistor 6 which is connected to the ground through a resistor 9, resistors 10 and 11 that are connected between the power supply voltage Vcc line and the base and between the base and the ground, respectively, to form a base bias supply circuit, and the collector of the transistor 6 is connected to the power supply voltage Vcc line through a resistor 12.

The quick start-up circuit 3 has a configuration in which a start-up quickening NPN transistor 13 (hereinafter simply referred to as transistor 13), with the collector connected to the power supply voltage Vcc line, has the base connected to the power supply voltage Vcc line through a capacitor 14 and to the ground through a diode 15 in backwards, and further has the emitter connected to the base of the transistor 6 at point A.

Next, the operation of the crystal oscillator 1—1 is explained.

Here, since the crystal oscillating circuit 2 is a typical Colpitts oscillating circuit and its operation is already known, the description of the operation is omitted.

When the power supply voltage Vcc is applied, a current that charges the capacitor C14 immediately begins to flow, and the current flows into the base of the transistor 13 to turn on the transistor 13.

As a result, a voltage that rises steeply close to the power supply voltage Vcc is applied to the crystal resonator 5, and the crystal resonator 5 is therefore instantly driven to oscillate. This shortens the start-up time of the crystal oscillating circuit 2 in which the crystal oscillating circuit 2 reaches the oscillating state from the non-oscillating state.

When the charging of the capacitor 14 is completed, the charging current, which is the base current of the transistor 13, ceases to flow, and hence the transistor 13 turns off. Consequently, the crystal oscillating circuit 2 continues steady-state oscillation without the influence of the quick start-up circuit 3.

The diode 15 keeps the resistance between the base of the transistor 13 and the ground very high when the power supply voltage Vcc is being applied, allows the charge start-up on the capacitor 14 to discharge through the resistors R1 and R2 when the power supply voltage Vcc is removed. This diode 15 is not necessarily required. A resistor may be used instead of the diode 15.

Figure 2:
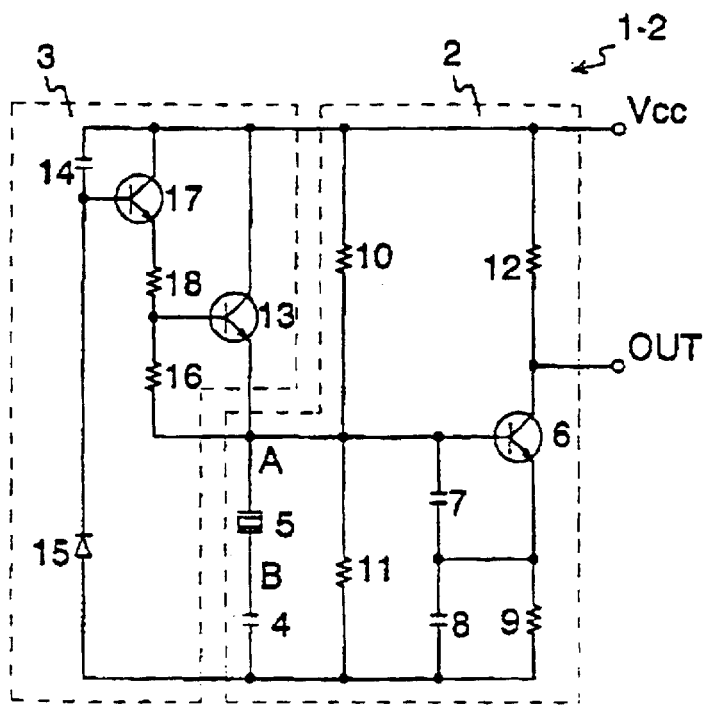
FIG. 2 is a schematic diagram of an embodiment of the crystal oscillator according to the present invention.

FIG. 2 shows another embodiment of the crystal oscillator 1-2 according to the present invention.

The crystal oscillator 1-2 shown in this figure is different from the embodiment shown in FIG. 1 in the circuit configuration of the quick start-up circuit 3.

Specifically, the quick start-up circuit 3 of the crystal oscillator 1-2 has a first transistor 13 whose collector is connected to the power supply voltage Vcc line and whose base is connected to the power supply voltage Vcc line through a capacitor 14 and to the ground through a diode 15 in reverse polarity, in the same manner as the transistor 13 of the quick start-up circuit 3 of the crystal oscillator 1—1. The emitter of the first transistor 13 is connected to the base of the transistor 6 of the crystal oscillating circuit 2 through resistors R16 and R18.

Further, the base of a second NPN transistor 17, whose collector is connected to the power supply voltage Vcc line, is connected to between the resistors R16 and R18, and the emitter of the transistor 71 is connected to the base of the transistor 6. Since the two transistors 13 and 17 are thus connected as a two-stage amplifier, the degree of amplification in total is much greater than that of the circuit shown in FIG. 1, and hence the rising speed of the pulse-like voltage applied to the crystal resonator 5 can be increased. Consequently, an even greater start-up quickening effect can be obtained.

A PNP transistor can also be used for the transistor that performs switching operation in the quick start-up circuit.

Figure 3:
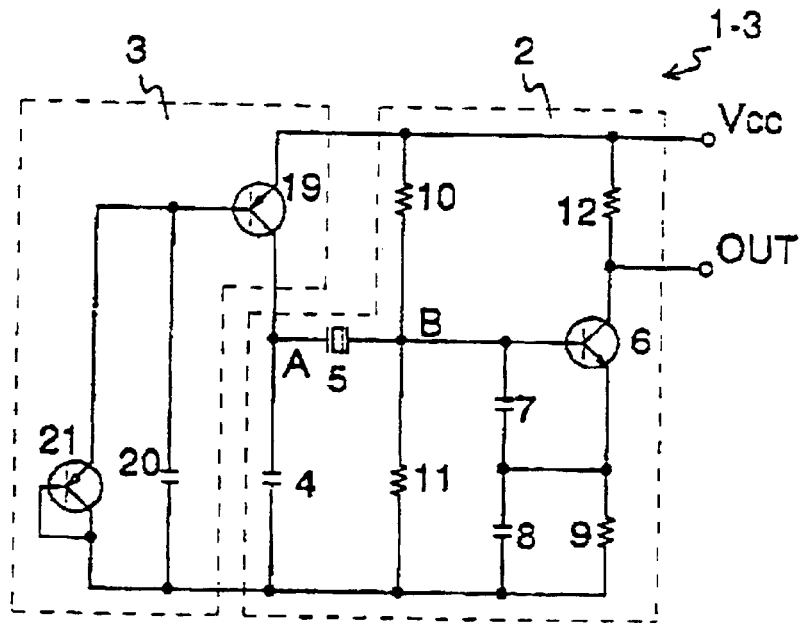
FIG. 3 is a schematic diagram of an embodiment of the crystal oscillator according to the present invention.
Figure 4:
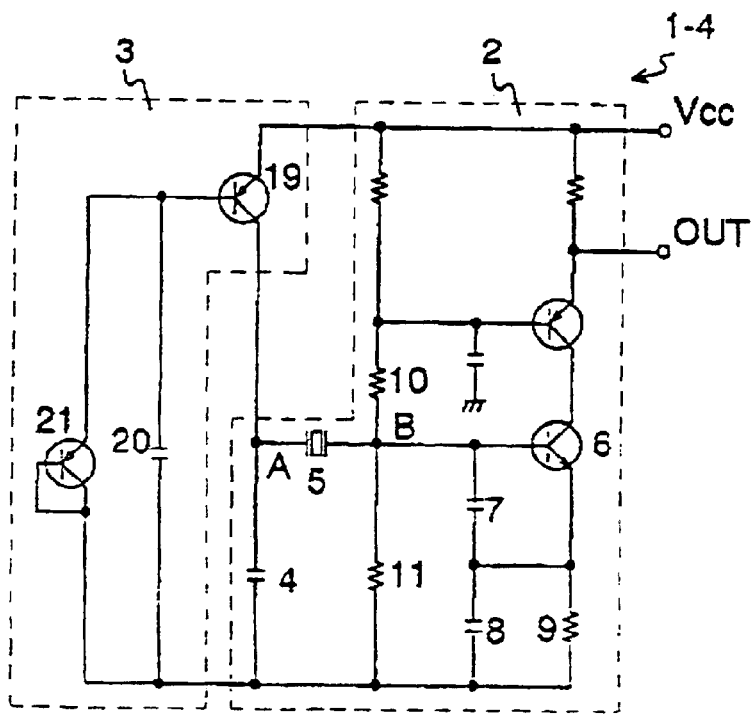
FIG. 4 is a schematic diagram of an embodiment of the crystal oscillator according to the present invention.

The crystal oscillators 1-3 and 1-4 shown in FIGS. 3 and 4 are other embodiments of the present invention. The crystal oscillating circuit 2 of the crystal oscillator 1-3 of FIG. 3 is the same typical Colpitts oscillating circuit as shown in FIGS. 1 and 2. The crystal oscillating circuit 2 of the crystal oscillator 1-4 of FIG. 4 is a Colpitts oscillating circuit with a buffer circuit connected in cascade.

The crystal oscillators 1-3 and 1-4 is characterized in that a PNP transistor 19 is used for the switching device for quickly starting-up the oscillating circuits, in their quick start-up circuits 3. In the quick start-up circuits 3, the emitter of the PNP transistor 19 is connected to the power supply voltage Vcc line, and the collector is connected to between the crystal resonator 5 and the capacitor 4 of the crystal oscillating circuit 2. The base of the transistor 19 is connected to the ground through a capacitor 20 and another PNP transistor 21 connected in parallel with the capacitor 20, whose emitter and collector are connected to the base of the transistor 19 and the ground, respectively, with the base connected to its own collector.

With the base connected to the collector, the transistor 21 functions as a diode.

In this configuration, when the power supply voltage Vcc is applied, a current that charges the capacitor C20 immediately begins to flow through the emitter and base of the transistor 19 to turn on the transistor 19.

As a result, a voltage that rises steeply close to the power supply voltage Vcc is applied to the crystal resonator 5, and the crystal resonator 5 is therefore instantly driven to oscillate. This shortens the start-up time of the crystal oscillating circuit 2 in which the crystal oscillating circuit 2 reaches the oscillating state from the non-oscillating state. When the charging of the capacitor 20 is completed, the charging current, which is the base current of the transistor 19, ceases to flow, and hence the transistor 19 turns off. Consequently, the crystal oscillating circuit 2 continues steady-state oscillation without the influence of the quick start-up circuit 3.

Figure 5:
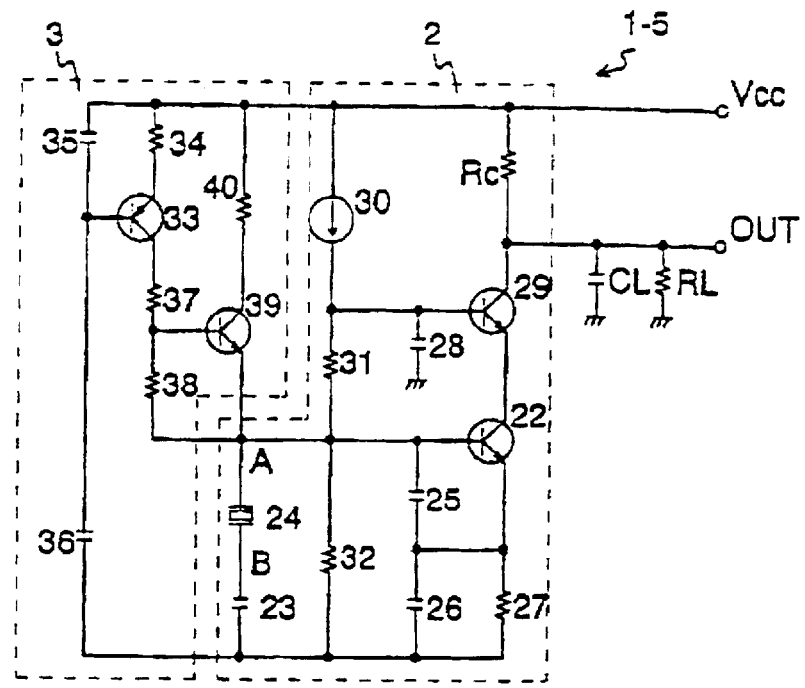
FIG. 5 is a schematic diagram of an embodiment of the crystal oscillator according to the present invention.

FIG. 5 is a schematic diagram that shows still another embodiment of the crystal oscillator according to the present invention.

The crystal oscillator 1-5 shown in FIG. 5 consists of a crystal oscillating circuit 2 encircled by a dashed line and a quick start-up circuit 3 enclosed by a one-dot chain line.

In the crystal oscillating circuit 2 of this embodiment, one terminal of a crystal resonator 24 with the other terminal connected to the ground through a capacitor 23 is connected to the base of an oscillating transistor 22, capacitors 25 and 26 connected in series are connected between the base of the transistor 22 and ground, and a point between the capacitor 25 and the capacitor 26 is connected to the emitter of the transistor 22 that is connected to the ground through a resistor 27.

In addition, the emitter of a transistor 29, whose base is connected to the ground through a capacitor 28 for bypassing high frequency noises, is connected to the collector of the above-described transistor 22 in a cascade connection. The collector of the transistor 29 is connected to the power supply voltage Vcc line through a load resistor Rc.

Further, to supply bias currents to the transistor 29 and transistor 22, a constant current source 30, resistor 31, and resistor 32 are connected between the base of the transistor 29 and the power supply voltage Vcc line, between the base of the transistor 29 and that of the transistor 22, and between the base of the transistor 22 and the ground, respectively.

The oscillating signal is drawn out from between the collector of the transistor 29 and the load resistor Rc through a capacitor C (not shown) for cutting out direct current. A capacitor CL and a resistor RL connected between the output terminal OUT and the ground are dummy loads to put the crystal oscillator 1-5 in the same condition as the actual condition in which crystal oscillator 1-5 is used. They are added in order to perform the test described later.

On the other hand, the quick start-up circuit 3 has the following circuit configuration. The emitter of a PNP transistor 33 is connected to the power supply voltage Vcc line through a resistor 34, and the base of the transistor 33 is connected to the power supply voltage Vcc line through a first capacitor C35 and to the ground through a second capacitor C36. The collector of the transistor 33 is connected to the base of the transistor 22 of the crystal oscillating circuit 2 through resistors 37 and 38 connected in series.

Further, the base of an NPN transistor 39 is connected to between the resistors 37 and 38, the collector is connected to the power supply voltage Vcc line through a resistor 40, and the emitter is connected to the base of the transistor 22 of the crystal oscillating circuit 2.

The operation and designing method of the crystal oscillator 1-5 are described below.

Here, since the crystal oscillating circuit 2 is a typical Colpitts oscillating circuit and its operation is already known, the description of the operation is omitted.

First, the basic operation of the quick start-up circuit 3 is described.

Figure 6:
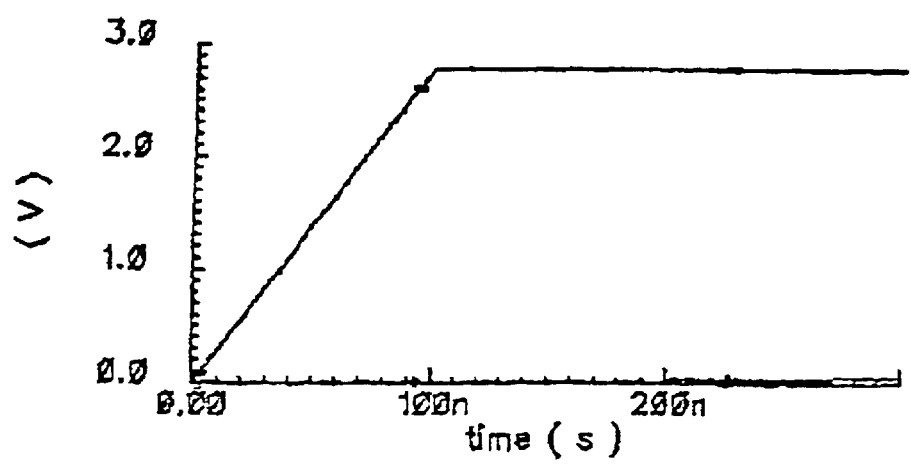
FIG. 6 is a graph that shows a rise characteristics of the power supply voltage Vcc.

Suppose that the power supply voltage Vcc with a rise characteristics (rise time: 100 ns) shown in FIG. 6, for example, is applied to the crystal oscillator 1-5. Since a charge current of the capacitors 35 and 36 occurs immediately after the power supply voltage Vcc start-up to be applied, a transient base bias voltage determined by the ratio of the capacitances of the capacitors 35 and 36 and the power supply voltage Vcc being rising is applied to the base of the transistor 33.

On the other hand, the power supply voltage Vcc is applied to the emitter of the transistor 33 through the resistor 34. However, no current flows from the emitter to the base while the power supply voltage Vcc is small.

A current begins to flow from the emitter to the base of the transistor 33 when the emitter-base voltage Veb reaches the threshold voltage (0.75V, for example), and the transistor 33 is turned on by the current.

The timing at which the transistor 33 start-up the ON operation is determined by the relationship between the rise of the base voltage applied by the voltage dividing circuit consisting of the capacitors 35 and 36 and the rise of the emitter voltage.

When the transistor 33 becomes on as described above, a base current is supplied to the transistor 39 from the power supply voltage Vcc line through the transistor 33, and the transistor 39 is therefore turned on. Consequently, the voltage on the power supply voltage Vcc line at the time is applied to the crystal resonator 24 through the transistor 39 and the resistor 40 as a start-up quickening voltage.

In this case, since a start-up quickening voltage that is steep in rise rate and high in voltage enough to drive the crystal resonator 24 forcefully is required to start-up the crystal oscillator 1-5 quickly, the ratio of the capacitance C35 of the capacitor 35 to the capacitance C36 of the capacitor 36 (C35/C36) is determined so that the transistor 33 is turned on when a predetermined time passes from the point of time at which the power supply voltage Vcc start-up to be applied. By thus determining the capacitances of the capacitors 35 and 36, it is possible to operate the quick start-up circuit 3 when the power supply voltage Vcc reaches a high enough voltage to drive the crystal resonator 24 by the quick start-up circuit 3.

Specifically, the timing for the transistor 33 to start-up the operation, which determines the timing of the quick start-up circuit 3, is the point of time at which the emitter voltage Ve of the transistor 33 reaches the base voltage Vb plus the threshold voltage Veb (0.75V) between the emitter and the base of the transistor 33 (Ve≧Vb+Veb (0.75V)).

Further, the smaller the capacitance C36 of the capacitance 36 is determined so as to be in relation to the capacitance C35 of the capacitance 35, the higher becomes the voltage applied to the base of the transistor 33 according to the voltage division ratio by the capacitors 35 and 36. Therefore, it takes a longer time for the emitter and base voltages Ve and Vb to meet the relationship Ve≧Vb+Veb (0.75V) after the application of the power supply voltage Vcc, and the timing of the start-up of the operation of the transistor 33 can be delayed.

FIG. 7 is the results of a simulation for confirming the relationship between the capacitance ratio of the capacitors 35 and 36 and the timing of turning-ON of the transistor 33.

First, FIG. 7(a) shows the relationship between the base voltage (with respect to the ground) Vb and emitter voltage Ve (with respect to the ground) of the transistor 33 and the rise characteristics of the power supply voltage Vcc in the case where the capacitance C36 of the capacitor 36 is 3 pF or 15 pF with the capacitor 35 kept at the same value C35=5 pF.

As is apparent from this figure, the rise of the base voltage Vb is faster for the smaller value of the capacitor 36, whereas the rise of the emitter voltage Ve is about the same as that of the power supply voltage Vcc for both C36=3 pF and 15 pF until the transistor 33 turns ON.

Since the emitter-base voltage Veb must become equal to or greater than 0.75V in order for the transistor 33 to turn ON as described above and hence the emitter current does not flow while the transistor 33 is off, the emitter voltage Ve is approximately the same as the power supply voltage Vcc.

This can also be understood from that the rise of the Ve voltage curve for C36=15 pF is about the same as the rise characteristics of the power supply voltage Vcc until approximately 40 ns after the application of the power supply voltage Vcc as shown in FIG. 7(a).

As described above, it is at the timing at which the voltage differential between the Ve and Vb voltage curves shown in FIG. 7(a) reaches 0.75V when the transistor 33 turns ON. The rise of the emitter voltage Ve is about the same regardless of the capacitance of the capacitor 36, whereas the rise of the base voltage Vb is slower for larger capacitance 15 pF of the capacitor 36, as described above and shown in FIG. 7(a). The emitter voltage Ve and base voltage Vb therefore meet the condition that their voltage differential is equal to or greater than the emitter-base threshold voltage 0.75V in due course of time.

Although the detailed description is given later, the timing when the transistor 33 turns ON is about 40 ns for C36=15 pF and about 80 ns for C36=5 pF as estimated from the results shown in FIG. 7(a).

As described above, the quick start-up circuit 3 can be designed so as to operate when the power supply voltage Vcc becomes high enough by appropriately delaying the timing of turning-ON of the transistor 33 using the capacitance ratio of the capacitors 35 and 36.

FIG. 7(b) shows the results of a simulation of the rise characteristics of the emitter-base voltage Veb (Veb=Ve−Vb) of the transistor 33 for capacitances 3 pF, 4 pF, 7 pF, and 15 pF of the capacitor 36.

Curve A is the rise characteristics for C36=3 pF, curve B is the rise characteristics for C36=4 pF, curve D is the rise characteristics for C36=7 pF, and curve E is the rise characteristics for C36=15 pF.

In this simulation, the power supply voltage Vcc is 2.8V, the rise characteristics is about 100 ns by the time from the application of the power supply voltage until the supply voltage reaches a constant voltage Vcc=2.8V, and capacitor 35=5 pF, resistor 34=1 kΩ, resistor 37=1 kΩ, resistor 38=10 kΩ, and resistor 40=200 Ω.

As shown in FIG. 7(b), the time Teb at which the voltage Veb reaches the threshold (0.75V) becomes shorter with the value of the capacitor 36, and Teb=about 83 ns for C36=3 pF, Teb=72 ns for C36=4 pF, Teb=55 ns for C36=7 pF, and Teb=41 ns for C36=15 pF.

The reason can be understood from the above description of FIG. 7(a).

Further, the rise characteristics of the emitter voltage Ve of the transistor 33 begins to part away from that of the power supply voltage Vcc at about the point of time at which the emitter-base voltage Veb (=Ve−Vb) just exceeds the threshold voltage as shown in FIG. 7(a). This is because a voltage drop occurs across the resistor 34 by the emitter current that begins to flow by the turning-ON of the transistor 33 and the emitter voltage is lowered by the voltage drop across the resistor 34.

As understood from the above description, the voltage V34 across the resistor 34 must not be taken into account when determining the timing at which the transistor 33 turns ON.

Moreover, to determine the values of the circuit elements of the quick start-up circuit 3 most suitable for start-up the crystal oscillating circuit 2 effectively, it is preferable to pay attention to the collector current of the transistor 33 in addition to taking into consideration the turning-On timing of the transistor 33.

Specifically, the emitter-base voltage Veb of the transistor 33 reaches the threshold voltage 0.75V before the power supply voltage Vcc reaches the specified voltage for all values 3 pF to 15 pF of the capacitor 36, as shown in FIG. 7(b). However, it is also preferable to supply an enough base current to the next-stage transistor 39 so that a pulse-like steep rise high voltage can be applied by the transistor 39 to the crystal oscillating circuit 2 as a start-up quickening voltage.

On the other hand, if a too small value is specified for the capacitor 36 by giving attention only to delaying the turning-on timing of the quick starter circuit, the voltage across the resistor 34 is smaller after the Veb exceeds the threshold voltage. Therefore, the base current and hence the collector current of the transistor 33 are smaller, and accordingly the current supplied to the base of the transistor 39 is smaller. As a result, the collector current of the transistor 39 does not increase abruptly to a sufficiently large value, and the rise characteristics of a start-up quickening voltage becomes slower.

On the other hand, if the value of the capacitor 36 is too large, the quick start-up circuit 3 turns ON before the power supply voltage Vcc rises to a sufficiently high voltage, and hence a sufficiently high start-up quickening voltage cannot be generated.

Figure 8:
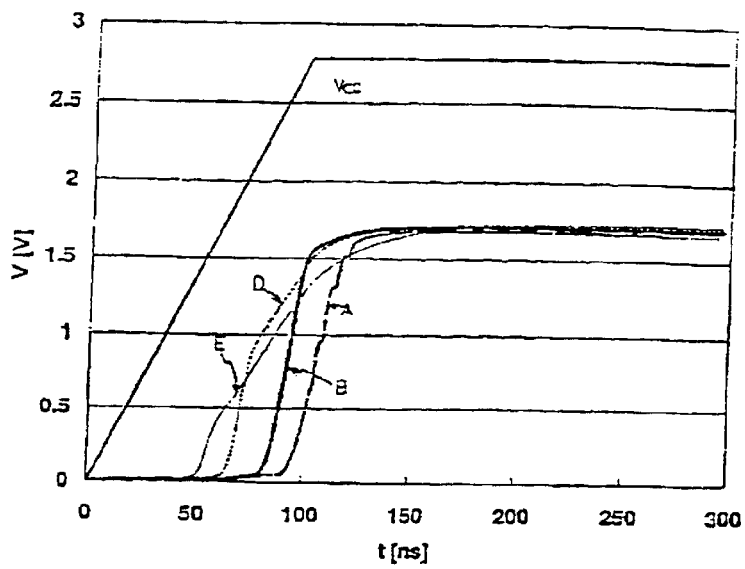
FIG. 8 is a graph that shows the rise characteristics of the start-up quickening voltages of the crystal oscillator in FIG. 5.

FIG. 8 shows the results of a simulation of the relationship between the rise characteristics of the start-up quickening voltage and the capacitance ratio of the capacitor 35 to the capacitor 36. The curves in the graph show the emitter voltage of the transistor 39 in FIG. 5. Curve A is the rise characteristics for C36=3 pF, curve B is the rise characteristics for C36=4 pF, curve D is the rise characteristics for C36=7 pF, and curve E is the rise characteristics for C36=15 pF.

The rise characteristics of the emitter-base voltage Veb are the same as those shown in FIG. 7(b), and the values of the other elements of the quick start-up circuit 3 are the same as those used in the description of FIG. 6.

Since the degree of delay of the turning-ON timing of the transistor 33 from the application of the power supply voltage Vcc becomes greater with the increase in the capacitance ratio C35/C36 as shown in FIG. 8, the quick start-up circuit 3 operates when the power supply voltage Vcc has risen to a higher voltage, and hence a higher start-up quickening voltage can be generated.

The time which the start-up quickening voltage A (C36=3 pF) takes to rise 1.5V from the start-up of rise is about 28 ns, whereas the same time of the start-up quickening voltage B (C36=3 pF) is about 20 ns. Therefore, the rise speed of the start-up quickening voltage B is faster than that of the start-up quickening voltage A by 8 ns.

Since the start-up quickening voltage A is generated with an excessive time delay compared to the start-up quickening voltage B, a larger part of the power supply voltage Vcc is taken by the capacitor 36. Consequently, the voltage across the capacitor 35 is smaller when the quick start-up circuit 3 turns ON to generate the start-up quickening voltage A than the start-up quickening voltage B. The base current and hence the collector current of the transistor 33 are therefore smaller for the start-up quickening voltage A than for the start-up quickening voltage B. For this reason, the rise of the start-up quickening voltage A is slower than that of the start-up quickening voltage B.

It can also be readily seen from the start-up quickening voltages D (C36=7 pF) and E (C36=15 pF) that, when the quick start-up circuit 3 turns ON too soon before the power supply voltage Vcc rises to a sufficiently high voltage, a start-up quickening voltage having a steep rise cannot be obtained.

Figure 9:
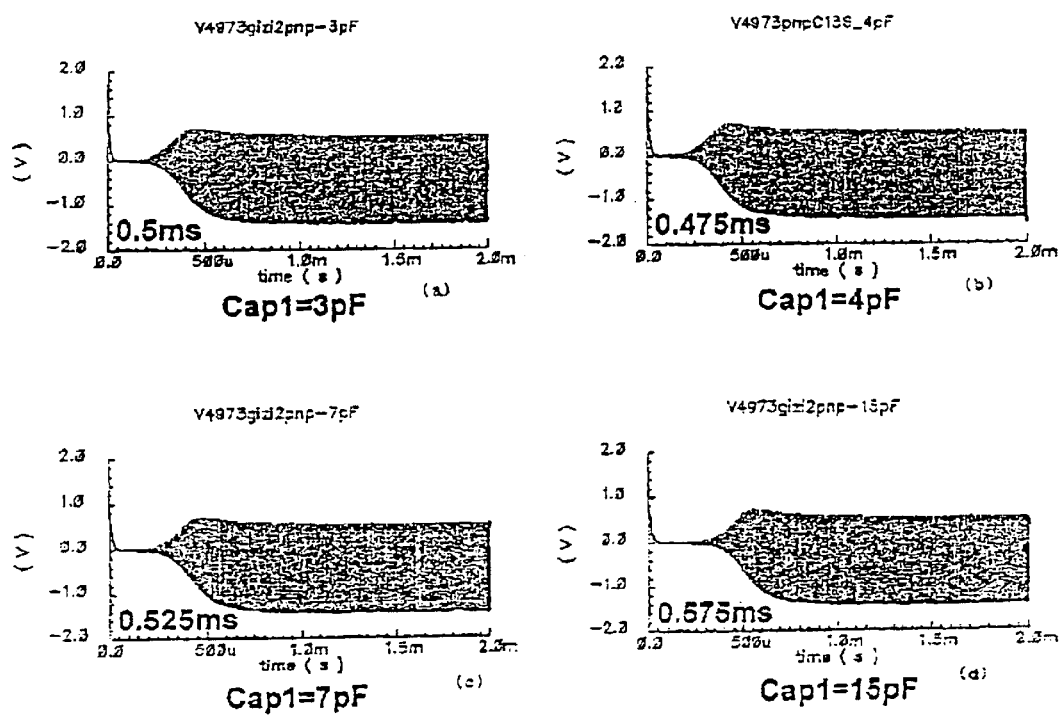
FIGS. 9(a) to (d) shows the start-up characteristics of the crystal oscillator in FIG. 5.

FIG. 9 shows the results of a simulation of the oscillation start-up characteristics of the crystal oscillator 1-5 when different start-up quickening voltages are applied. FIG. 9(a) is in the case when the start-up quickening voltage A is applied, FIG. 9(b) is in the case when the start-up quickening voltage B is applied, FIG. 9(d) is in the case when the start-up quickening voltage D is applied, and FIG. 9(e) is in the case when the start-up quickening voltage E is applied.

As shown in FIG. 9, the start-up time is about 0.500 ms in the case when the start-up quickening voltage is A, 0.475 ms in the case when the start-up quickening voltage is B, 525 ms in the case when the start-up quickening voltage is D, and 0.575 ms in the case when the start-up quickening voltage is E. From these results, it can be understood that the crystal oscillator 1-5 can be started up most quickly when the capacitor 36 is 4 pF.

From the above analysis, it can be understood that there are most suitable values of the capacitors 35 and 36 for individual circuits. By determining the values of the capacitors 35 and 36 so that a voltage Veb greater than the threshold value can be applied to the emitter and base of the transistor 33 at the timing when the condition with which the quick starter circuit 3 can operate well, a steep rise start-up quickening voltage can be generated, and consequently it is made possible to start up the crystal oscillator 1-5 quickly.

The start-up time of a crystal oscillator made up of the crystal oscillating circuit 2 alone without the quick starter circuit 3 is about 1.2 ms. Compared with the crystal oscillator without the quick starter circuit 3, the crystal oscillator 1-5 has a faster start-up characteristics in any case where the start-up quickening voltage is A, B, D, or E.

Moreover, since the start-up time can be determined as desired by the capacitance ratio of the capacitors 35 and 36 and therefore can be appropriately adjusted to the start-up time required according to the use condition and circuit condition of the crystal oscillators.

Figure 10:
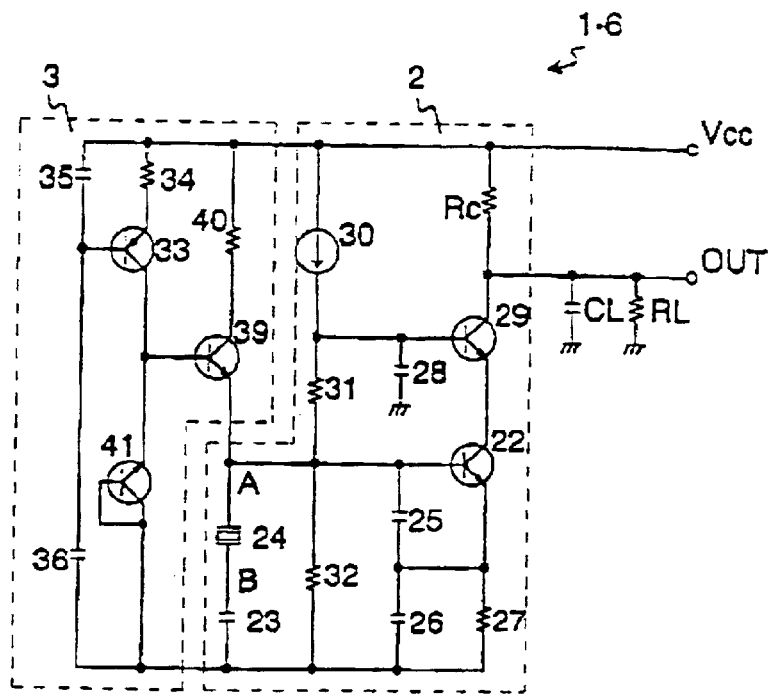
FIG. 10 is a schematic diagram of an embodiment of the crystal oscillator according to the present invention.
Figure 11:
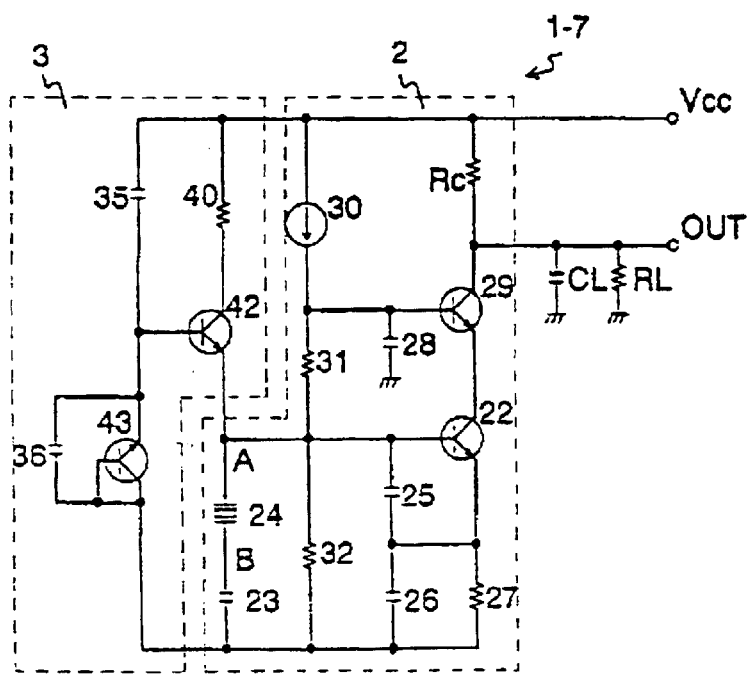
FIG. 11 is a schematic diagram of an embodiment of the crystal oscillator according to the present invention.
Figure 12:
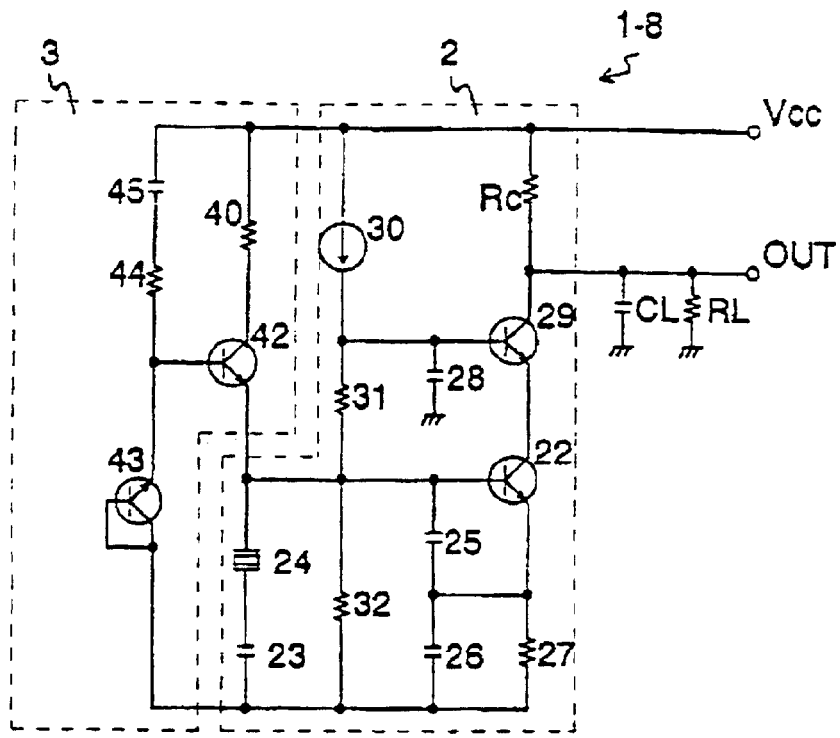
FIG. 12 is a schematic diagram of an embodiment of the crystal oscillator according to the present invention.

FIGS. 10 to 12 are schematic diagrams of other embodiments of the crystal oscillator of the present invention.

The crystal oscillator 1-6 shown in FIG. 10 is characterized in the configuration of the quick start-up circuit 3 4 in which the base of the transistor 39, which is connected to the collector of the transistor 33, is connected to the ground through a reverse-biased transistor 41 with the base connected to the collector (or a diode). This configuration has the effect of allowing negative charges which can occur on the base of the transistor 39 when power is not supplied, for example.

The crystal oscillator 1-7 shown in FIG. 11 is characterized in the configuration of the quick start-up circuit 3 in which an NPN transistor 42 is connected in forward bias between the power supply voltage Vcc line and the terminal of the crystal resonator 24 connected to the base of the transistor 22, capacitors 35 and 36 are connected in series between the power supply voltage Vcc line and the ground, the base of the transistor 42 is connected to between the capacitors 35 and 36, and a diode 43 is connected in reverse polarity between the base of the transistor 42 of the crystal oscillating circuit 2 and the ground in parallel with the capacitor 36.

The crystal oscillator 1-8 shown in FIG. 12 is a modification of the circuit shown in FIG. 11. In the quick start-up circuit 3 of the crystal oscillator 1-8, an NPN transistor 42 is connected in forward bias between the power supply voltage Vcc line and the terminal of the crystal resonator 24 connected to the base of the transistor 22 of the crystal oscillating circuit 2, the power supply voltage Vcc line and the base of the transistor 42 are connected with a capacitor 45 and a resistor connected in series, and the base of the transistor 42 is connected to the ground through a diode 43 in reverse polarity.

The turn-on timing of the quick start-up circuit 3 of the crystal oscillators 1-6 and 1-7 shown in FIGS. 10 and 11 can be determined by the capacitance ratio of the capacitors 35 and 36, and that of the quick start-up circuit 3 of the crystal oscillator 1-8 shown in FIG. 12 can be determined by the time constant of the serial circuit of the resistor 44 and the capacitor 45.

Figure 13:
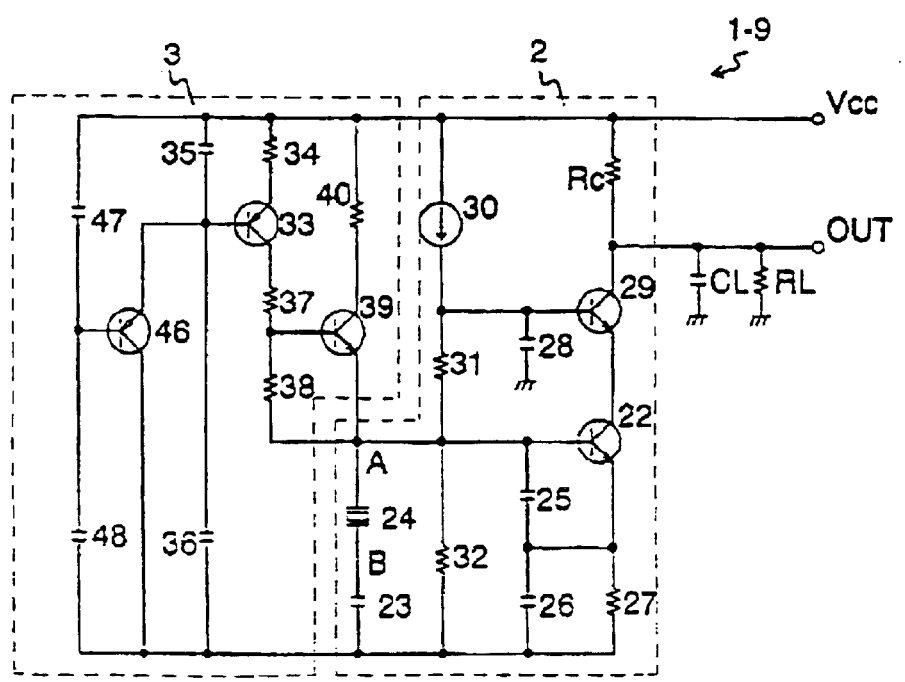
FIG. 13 is a schematic diagram of an embodiment of the crystal oscillator according to the present invention.
Figure 14:
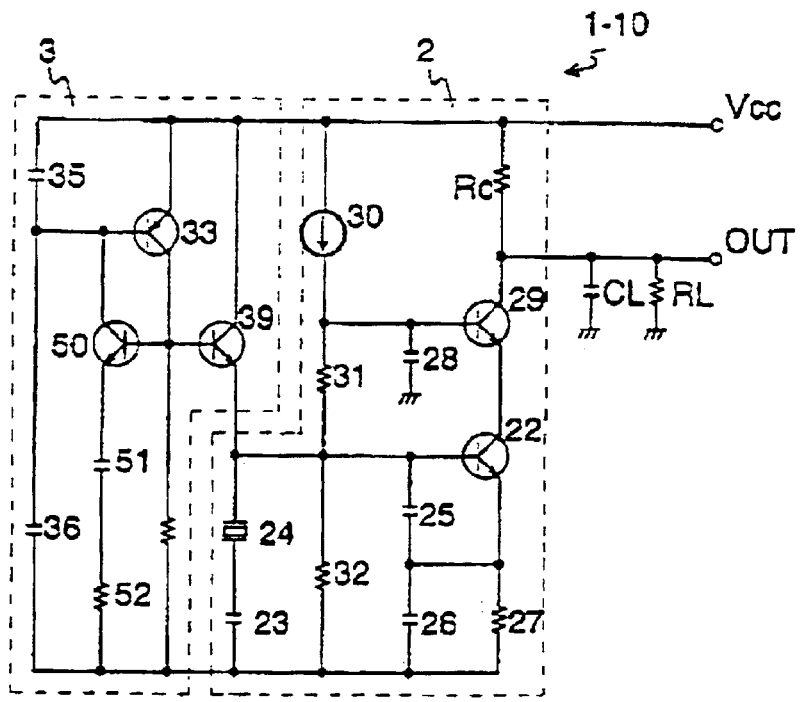
FIG. 14 is a schematic diagram of an embodiment of the crystal oscillator according to the present invention.
Figure 15:
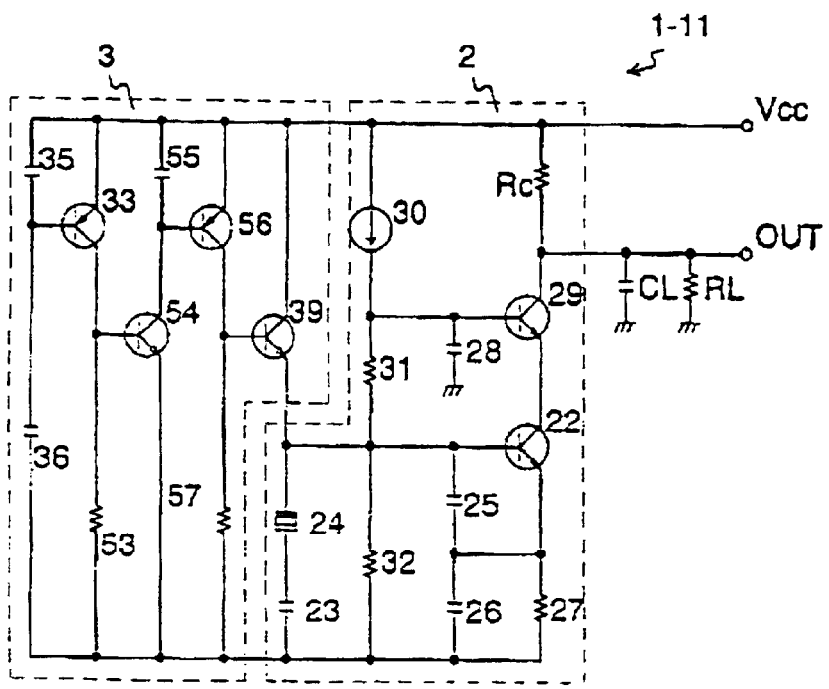
FIG. 15 is a schematic diagram of an embodiment of the crystal oscillator according to the present invention.

FIGS. 13 to 15 are schematic diagrams of other embodiments of the crystal oscillator of the present invention.

The crystal oscillators 1-9 to 1-11 can solve the problem that, in the circuit shown in FIG. 5, the capacitor 36 must have a large capacitance difficult to be formed in an integrated circuit, in order to make the increase in the emitter-base voltage of the transistor 33 abrupt enough, in the case when the rise characteristics of the power supply voltage Vcc is as slow as of about 1 μs.

Specifically, the crystal oscillator 1-9 shown in FIG. 13 is characterized in that a PNP transistor is connected in forward polarity between a point between the capacitors 35 and 36 and the ground, capacitors 47 and 48 are connected in series between the power supply voltage Vcc line and the ground, the base of the transistor 46 is connected to between the capacitors 47 and 48, and the capacitance ratio of the capacitors 47 and 48 is decided so that the turning-on of the transistor 46 is almost simultaneous with that of the transistor 33.

In the crystal oscillator 1-9 with the additional circuit described above, the transistor 46 turns on almost simultaneously with the transistor 33 for a limited length of time after the power supply voltage Vcc is switched on, and the whole or part of the base current of the transistor 33 flows through the transistor 46. This has the same effect as increasing the capacitance of the capacitor 36.

It is therefore made possible to increase the base current of the transistor 33 and thereby apply a steep-rise start-up quickening voltage to the crystal resonator 24.

The crystal oscillator 1-10 shown in FIG. 14 is different from the configuration of the crystal oscillator 1-5 shown in FIG. 5 in that the collector of the transistor 33 is connected to the ground through a resistor 49, the base of the transistor 39 and that of another transistor 50 are connected to the collector to the transistor 33, the emitter of the transistor 50 is connected to the ground through a capacitor 51 and a resistor 52 connected in series, and the collector of the transistor 50 is connected to the base of the transistor 33.

The capacitor 51 and the resistor 52 serve as an emitter load of the transistor 50 and raise the voltage of the bases of the transistor 50 and the transistor 39 close to the power supply voltage when the transistor 50 turns ON.

Further, the capacitor 51 performs the function of turning off the quick start-up circuit 3 when the power supply voltage Vcc reaches the steady state.

In the crystal oscillator 1-10 having the configuration described above, a base current of the transistor 33 conducts at the timing according to the voltage division ratio by the capacitors 35 and 36, causing the collector current of the transistor 33 to flow. When part of the collector current of the transistor 33 flows into the base of the transistor 50 as the base current, the transistor 50 functions as a path to draw the base current of the transistor 33 into.

This function of the transistor 50 makes it possible to allow a large base current to flow from the base of the transistor 33 with a steep rise without using a large-capacitance capacitor for the capacitor 36. As a result, a large collector current flows from the transistor 33, and it is made possible to apply a start-up quickening voltage with a steep rise characteristics to the crystal resonator 24 through the transistor 39.

The crystal oscillator 1-11 shown in FIG. 15 has a configuration in which the collector of the transistor 33 is connected to the ground through a resistor 53, the base of an NPN transistor 54 is connected to the collector of the transistor 33, the collector of the transistor 54 is connected to the power supply voltage Vcc line through a capacitor 55 and the emitter is connected to the ground, the base of a PNP transistor 56 is connected to the collector of the transistor 54, the emitter of the transistor 56 is connected to the power supply voltage Vcc line and the collector is connected to the ground through a resistor 57, the base of another NPN transistor 39 is connected to the collector of the transistor 56, the collector to the transistor 39 is connected to the power supply voltage Vcc line, and the emitter of the transistor 39 is connected to one terminal of the crystal resonator 24 that is connected to the transistor 22 of the crystal oscillating circuit 2.

In the crystal oscillator 1-11 of this configuration, the transistor 33 turns ON at the time determined according to the voltage division ratio by the capacitors 35 and 36 after the power supply voltage Vcc is applied.

The collector current of the transistor 33 then raises the base voltage of the transistor 54 to turn the transistor 54 ON. The turning ON of the transistor 54 to turn the transistor 54 ON. The turning ON of the transistor 54 turns the transistor 56 ON.

The capacitor 55 has the function of keeping the base voltage of the transistor 56 close to the power supply voltage Vcc so that the transistor 56 does not turn ON until the transistor 54 turns ON.

The transistor 54, when having turned ON, serves as the path which allows the base current of the transistor 56 to flow, and hence it is made possible to let a large base current flow from the base of the transistor 56.

By the turning ON of the transistor 56, the transistor 39 is supplied with a large base current with a steep rise. As a result, a steep-rise start-up quickening voltage can be applied to the crystal resonator 24 from the power supply voltage Vcc line through the transistor 39.

In the above description, crystal oscillators with various quick start-up circuits of the type that applies a start-up quickening voltage to one terminal of the crystal resonator are explained as embodiments of the present invention. However, the present invention is not limited to those described above, but may also be the crystal oscillators of the configurations described below.

FIGS. 16 to 25 are schematic diagrams of other embodiments of the present invention.

Figure 16:
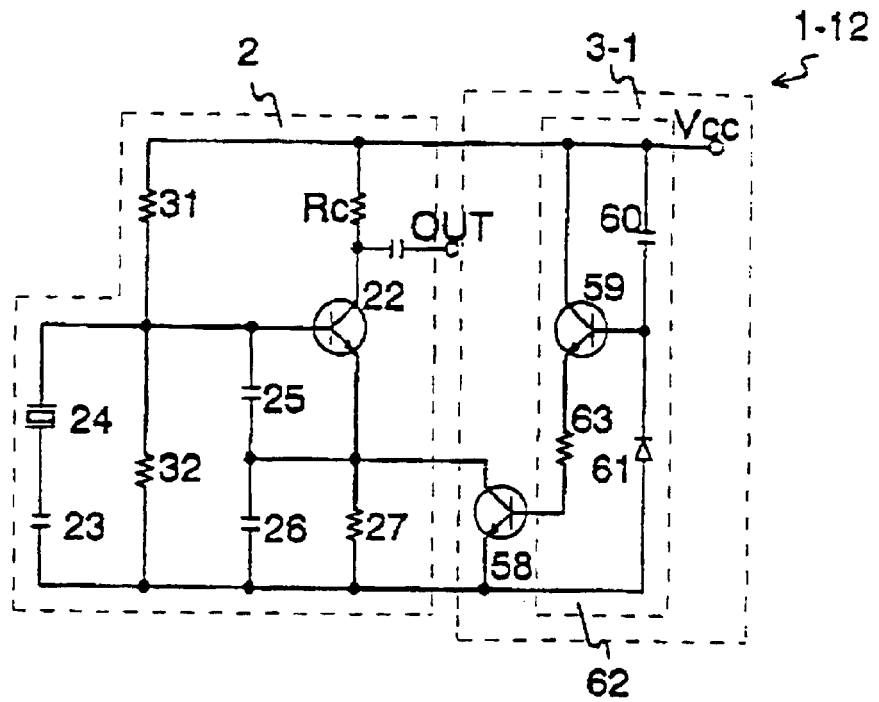
FIG. 16 is a schematic diagram of an embodiment of the crystal oscillator according to the present invention.

The crystal oscillator 1-12 shown in FIG. 16 consists of a crystal oscillating circuit 2 encircled by a dashed line and a quick start-up circuit 3-1 enclosed by a one-dot chain line. The crystal oscillating circuit 2 is a typical Colpitts crystal oscillating circuit, and the configuration is already described above. Therefore, the same reference numerals are assigned to the same components as those of the crystal oscillator shown in FIG. 5, and the explanation is omitted.

The quick start-up circuit 3-1 has a switch circuit using a second transistor 58 as the switching device and a switch control circuit 62 in which the base of a third transistor 59 with the collector connected to the power supply voltage Vcc line is connected to the power supply voltage Vcc line through a capacitor 60 and to the ground through a diode 61 in reverse polarity, the base of the transistor 58 being connected to the emitter of the transistor 59 through a resistor 63 and the collector of the transistor 58 being connected to the emitter of the transistor 22. The operation of the crystal oscillator 1-12 of this configuration is described below.

Here, since the crystal oscillating circuit 2 is a typical Colpitts oscillating circuit and its operation is already known, the description of the operation is omitted.

When the power supply voltage Vcc is applied, a charging current of the capacitor C60 begins to flow through the base and emitter of the transistor 59, resistor 63, and the base and emitter of the transistor 58 at a time at which the power supply voltage reaches the base-emitter voltage of the transistor 59 plus that of the transistor 58. By this base current of the transistor 59, the emitter current of the transistor 59 feeds into the base of the transistor 58 through the resistor 63 to make the transistor 58 conduct (ON operation). The emitter voltage of the transistor 22 therefore lowers close to the ground.

This steep fall of the emitter voltage of the transistor 22 is applied to one terminal of the crystal resonator 24 through the capacitor 25 to make the crystal resonator 24 begin to vibrate forcibly, simultaneously charging the capacitor 25 quickly. Consequently, the crystal oscillating circuit 2 starts up quickly.

On the other hand, when the power supply voltage Vcc reaches the steady state a certain time after the power supply voltage Vcc is applied, the charging current of the capacitor 60 stops flowing. The transistor 59 therefore turns off, quickly stopping the supply of the base current to the transistor 58, and hence the transistor 58 turns off (OFF operation). Consequently, the crystal oscillating circuit 2 can continue the steady-state operation without the influence of the quick start-up circuit 3-1.

The diode keeps the resistance between the base of the transistor 58 and the ground at a high impedance while the power supply voltage Vcc is being applied, and performs the function of allowing the charge start-up in the capacitor 60 to discharge when the power supply voltage Vcc is switched off.

In this configuration, a resistor of a large resistance can also be used instead of the diode 61. However, since it is difficult to form a resistor of a large resistance in integrated circuits, use of the diode 61 is preferable.

Figure 17:
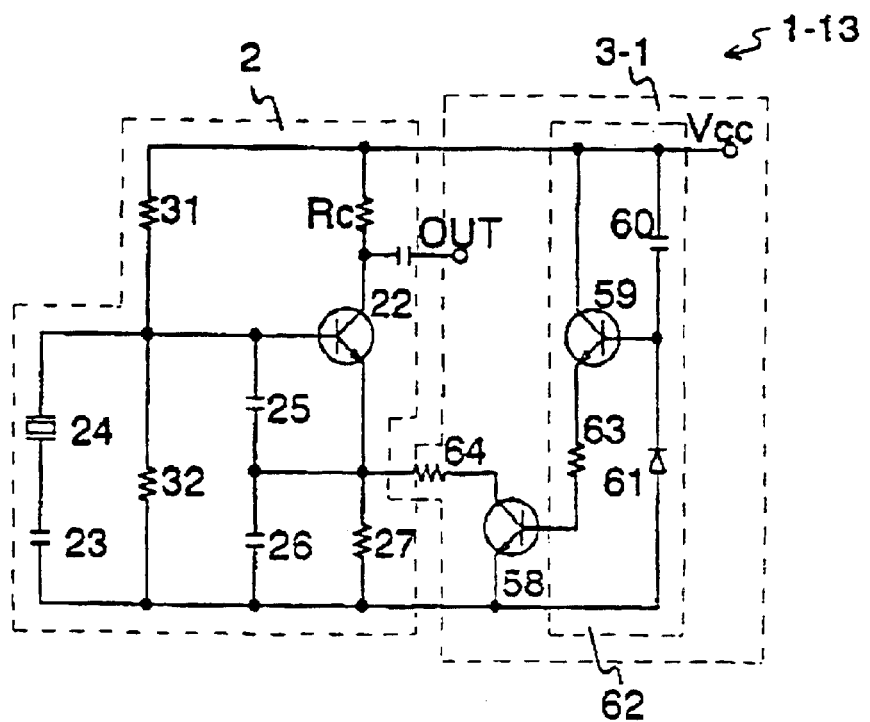
FIG. 17 is a schematic diagram of an embodiment of the crystal oscillator according to the present invention.

Further, when it is necessary to separate the transistor 38 and the crystal oscillating circuit 2 with respect to alternating current, the configuration shown in FIG. 17 can be used.

FIG. 17 shows another embodiment of the crystal oscillator according to the present invention.

The crystal oscillator 1-13 shown in this figure is characterized in that the emitter of the first transistor 22 is connected to the collector of the second transistor 58 through a resistor 64.

By this configuration, it is made possible to prevent part of the signal current in the oscillation loop of the crystal oscillating circuit 2 from flowing out into the transistor 58 while the oscillation is staring up.

Figure 18:
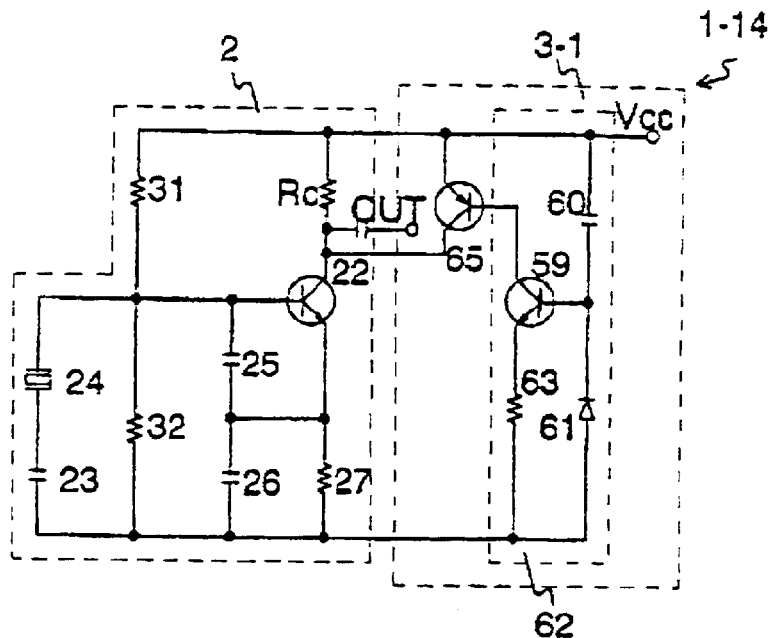
FIG. 18 is a schematic diagram of an embodiment of the crystal oscillator according to the present invention.

The crystal oscillator 1-14 shown in FIG. 18 consists of a crystal oscillating circuit 2 encircled by a dashed line and a quick start-up circuit 3-1 enclosed by a one-dot chain line.

The crystal oscillating circuit 2 is a typical Colpitts crystal oscillating circuit whose configuration is already described above with reference to FIG. 3, and hence the description of its configuration is omitted.

The quick start-up circuit 3-1 of this crystal oscillator 1-14 has a switch circuit in which the emitter of a PNP transistor 65, fifth transistor, is connected to the power supply voltage Vcc line, the base is connected to the collector of a sixth transistor 59, the emitter of the transistor 59 is connected to the ground through a resistor 63, and the base of the transistor 59 is connected to the power supply voltage Vcc line through a capacitor 60 and to the ground through a diode 61 in reverse polarity.

Here, since the crystal oscillating circuit 2 is a typical Colpitts oscillating circuit and its operation is already known, the description of the operation is omitted.

When the power supply voltage Vcc is applied, a charging current of the capacitor C60 feeds into the base of the transistor 59 to turn the transistor 59 ON. The turning-ON of the transistor 59 allows a large base current to flow out from the base of the transistor 65, and the transistor 65 turns ON, pulling up the voltage of the collector of the transistor 22 close to the power supply voltage Vcc.

As the collector voltage of the transistor 22 rises, the collector current of the transistor 22 increases. It is therefore made possible to make the crystal resonator 24 begin to vibrate forcibly without changing the impedance between the terminals of the capacitor 9 that is a part of the load capacitors of the oscillation loop circuit. Consequently, the crystal oscillating circuit 2 reaches the steady-state oscillation in a shortened time. When the power supply voltage Vcc reaches the steady-state voltage at a certain time after it is applied, the charging current disappears to turn off the transistor 59, which turns off the transistor 65. As a result, the resistor Rc alone serves as the collector resistor of the transistor, and hence the crystal oscillator 1-14 continues the steady-state oscillation without power consumption and the effect of the quick start-up circuit 3-1.

Figure 19:
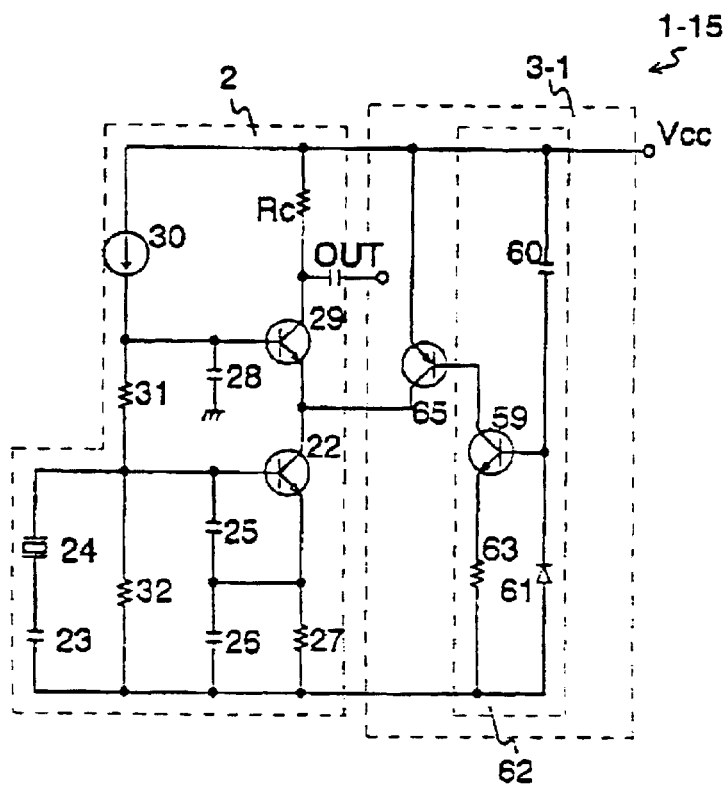
FIG. 19 is a schematic diagram of an embodiment of the crystal oscillator according to the present invention.
Figure 20:
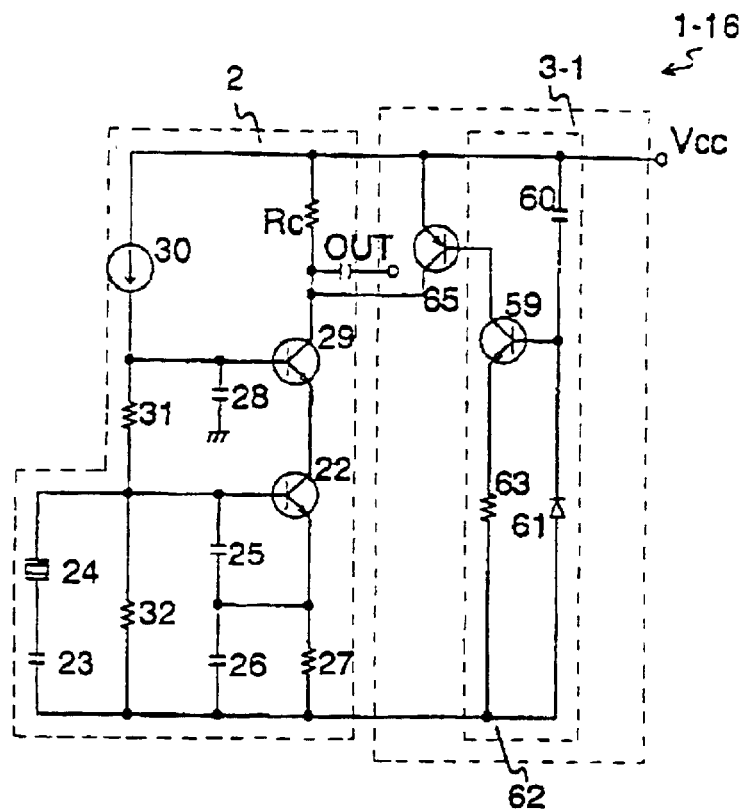
FIG. 20 is a schematic diagram of an embodiment of the crystal oscillator according to the present invention.

The crystal oscillators 1-15 and 1-16 shown in FIGS. 19 and 20 are characterized in that their crystal oscillating circuits have a buffer circuit connected in the cascade as the crystal oscillator shown in FIG. 5, and specifically in that a fourth transistor 29 is connected in cascade to the transistor 22, and the collector of the transistor 65 is connected to between the collector of the transistor 22 and the emitter of the transistor 29 in the crystal oscillator 1-15 shown in FIG. 19 and the collector of the transistor 65 is connected to the collector of the transistor 29 in the crystal oscillator 1-16 shown in FIG. 20.

The crystal oscillators of these configurations also have an improved start-up characteristics by the above-described function of the quick start-up circuit 3-1.

Figure 21:
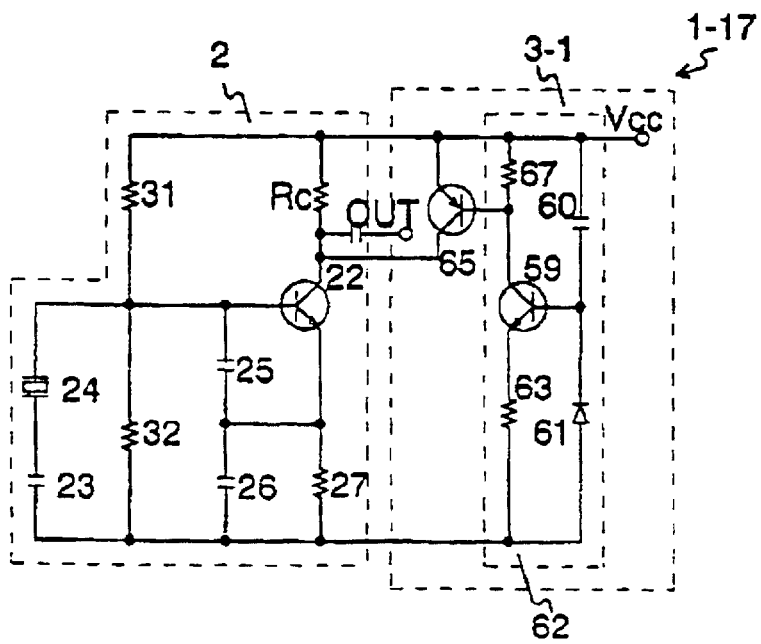
FIG. 21 is a schematic diagram of an embodiment of the crystal oscillator according to the present invention.
Figure 2:
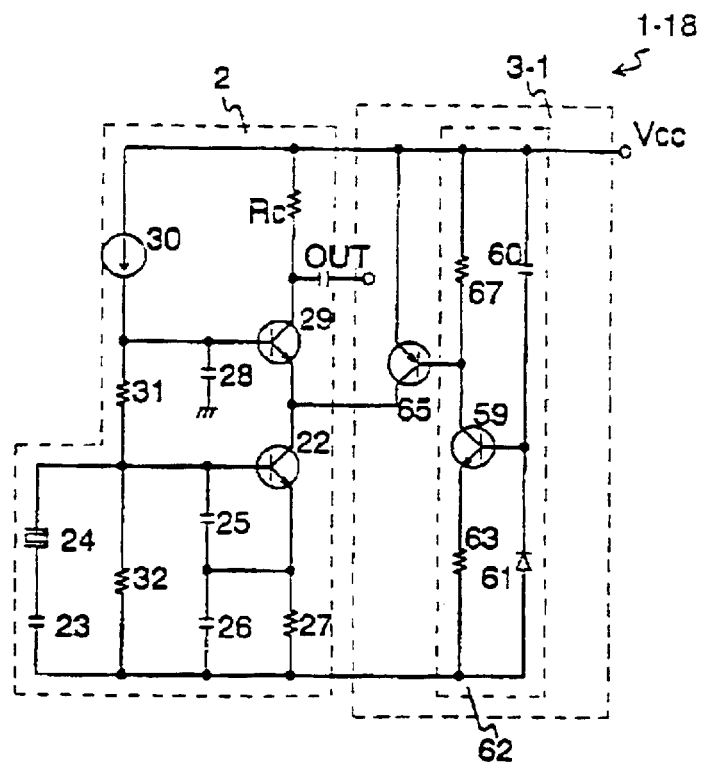
Figure 2:
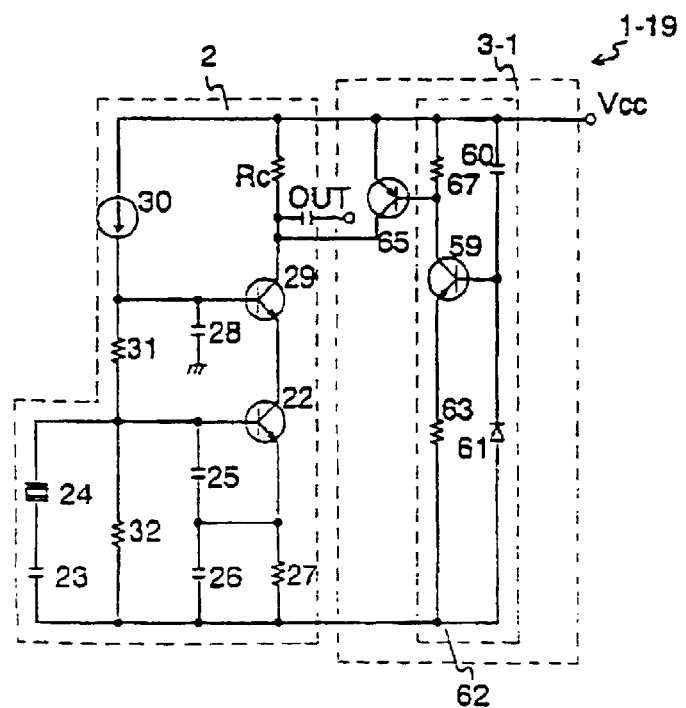

Further, the crystal oscillators 1-17 to 1-19 shown in FIGS. 21 to 23 are characterized in that the collector of the transistor 59 in the switch control circuit 62 is connected to the power supply voltage Vcc line through a resistor 59.

This configuration is for preventing the oscillation of the crystal oscillating circuit 2 from becoming unstable in the case where the transistor 65 turns on because of a leakage current of the diode 61 which flows from the collector to the base of the transistor 59 and serves as the base current of the transistor 59. By this configuration, the collector current of the transistor 59 is supplied from the power supply voltage Vcc line through the resistor 67, and therefore undesirable operation of the transistor 65 can be prevented.

Although start-up quickening voltage is applied to the emitter of the transistor 22 of the crystal oscillating circuit 2 in the crystal oscillators 1-12 and 1-13 shown in FIGS. 16 and 17, and to the collector of the transistor 22 or the collector of the transistor 29 in the crystal oscillators 1-14 to 1-19 shown in FIGS. 18 to 23, it may be applied to both the emitter of the transistor 22 and the collector of the transistor 22 or the collector of the transistor 29 to combine the functions of both types of quick start-up circuits.

Figure 24:
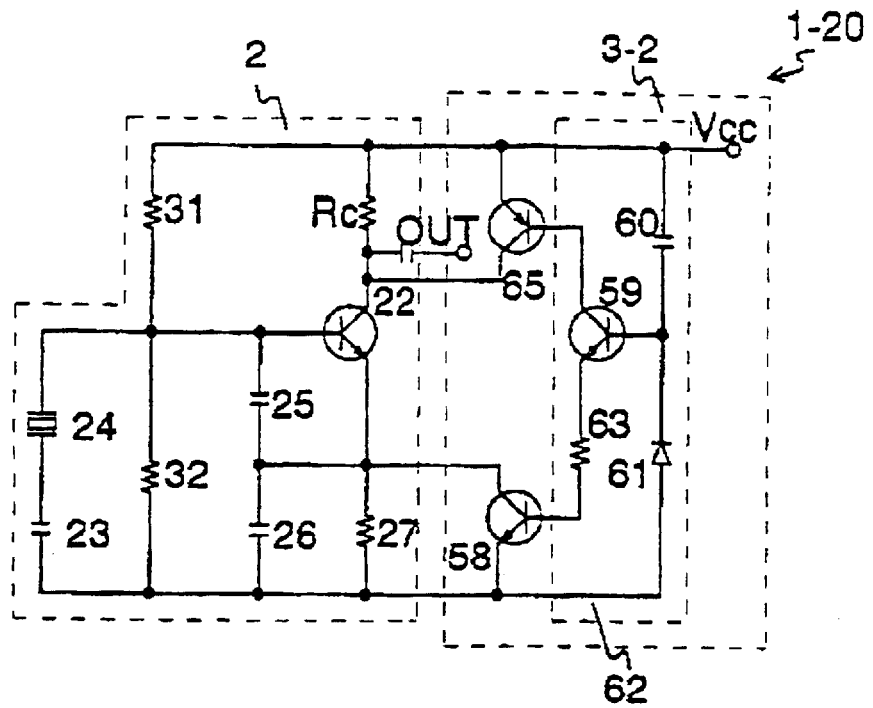
FIG. 24 is a schematic diagram of an embodiment of the crystal oscillator according to the present invention.

First, the crystal oscillator 1-20 shown in FIG. 24 is characterized in that the base of a PNP transistor 65 with the emitter connected to the power supply voltage Vcc line is connected to the collector to a transistor 59 of the switch control circuit 62, the base of the transistor 59 is connected to the power supply voltage Vcc line through a capacitor 60 and to the ground through a diode 61 in reverse polarity, the emitter of the transistor 59 is connected to the base of another switching transistor 58 through a resistor 63, the emitter of the transistor 58 is connected to the ground, and the collector of the transistor 58 is connected to the emitter of the transistor 22 and the collector of the transistor 65 is connected to the collector of the transistor 22.

Figure 25:
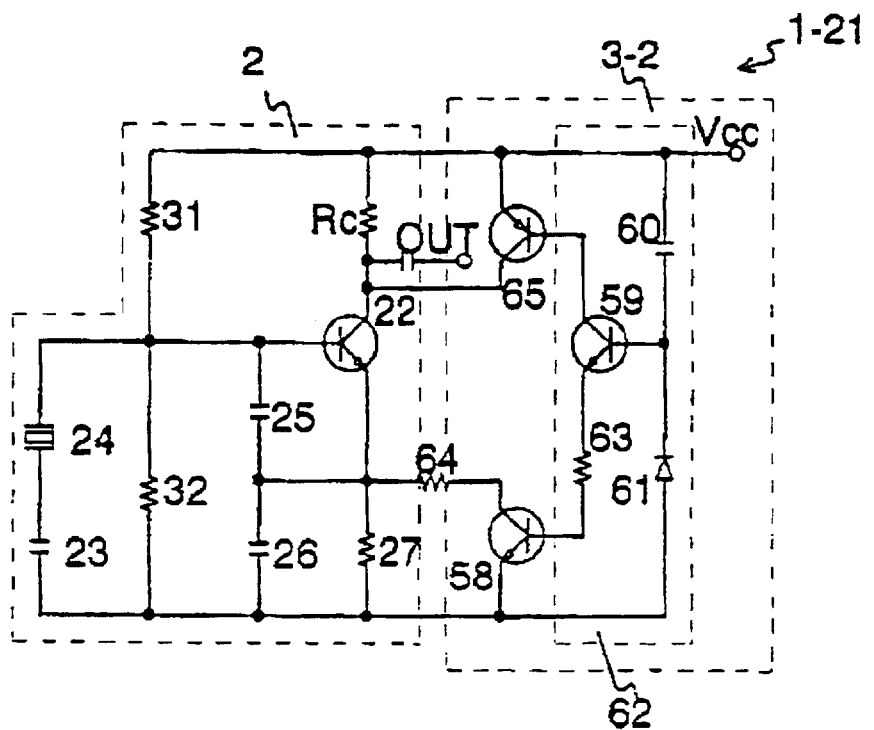
FIG. 25 is a schematic diagram of an embodiment of the crystal oscillator according to the present invention.

Next, the crystal oscillator 1-21 shown in FIG. 25 is characterized in that, in the quick start-up circuit 3-2 shown in FIG. 24, the collector of the transistor 58 is connected to the emitter of the transistor 22 through a resistor 64. The resistor 64 is for preventing the emitter of the transistor 22 from being connected to the ground with a small impedance while the transistor 58 is ON.

The crystal oscillators shown in FIGS. 19 to 23 may also be modified into the crystal oscillators with quick start-up circuits of combined-configuration type that are combinations of the quick start-up circuits shown in FIGS. 19 to 23 and those shown in FIGS. 16 and 17, in the same manner as the configurations of the crystal oscillators shown in FIGS. 24 and 25, though not shown in figures. Further, FIGS. 26 and 74 shows other embodiments of the crystal oscillator according to the present invention.

Figure 26:
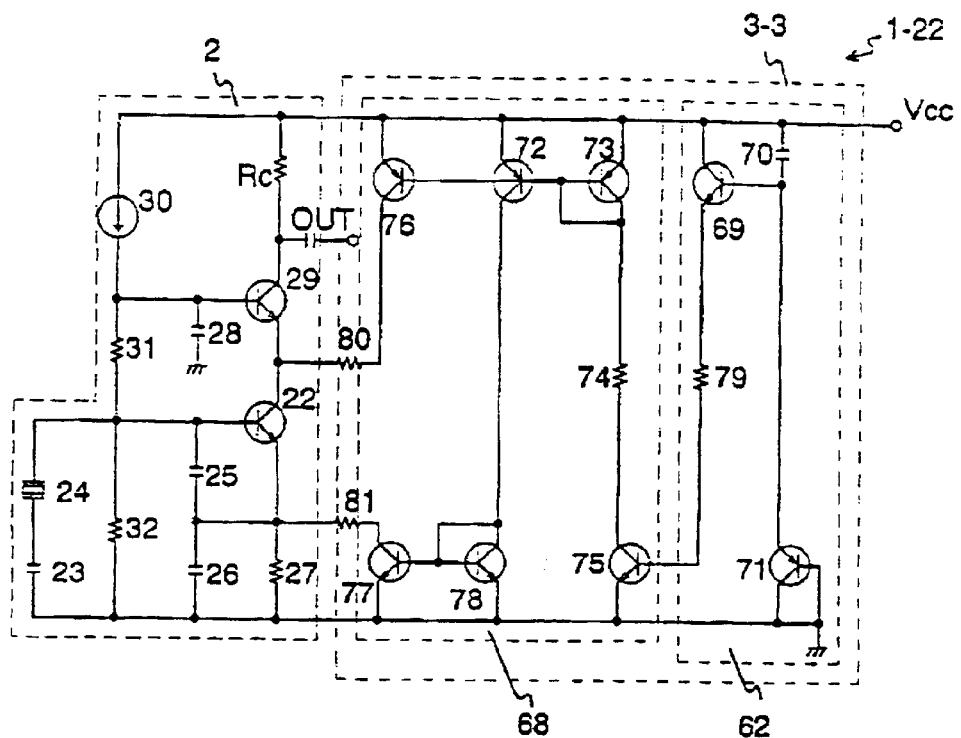
FIG. 26 is a schematic diagram of an embodiment of the crystal oscillator according to the present invention.

The crystal oscillator 1-22 shown in FIG. 26 consists of a crystal oscillating circuit 2 encircled by a dashed line and a quick start-up circuit 3—3 encircled by a one-dot chain line.

The crystal oscillating circuit 2 is a Colpitts crystal oscillating circuit, in which the same reference characters are assigned to the same components as those of the crystal oscillator shown in FIG. 5 described above, and hence the description of the configuration is omitted.

The quick start-up circuit 3—3 has a switch control circuit 62 encircled by a two-dot chain line and a current control circuit 68 encircled by a dashed line.

The switch control circuit 62 has a configuration in which the base of a transistor 69, with the collector connected to the power supply voltage Vcc line, is connected to the power supply voltage Vcc line through a capacitor 70 and to the ground through a transistor 71 connected up as a diode in reverse polarity.

The current control circuit 68 has a configuration in which the emitters of PNP transistors 72 and 73 connected in a current mirror are connected to the power supply voltage Vcc line, the bases of the transistors 72 and 73 and the collector of the transistor 73 are connected through a resistor to the collector of a transistor 75 with the emitter connected to the ground, the bases of the transistors 72 and 73 are connected to the base of a PNP transistor 76 with the emitter connected to the power supply voltage Vcc line, the collector of the transistor 72 is connected to the base of transistors 77 and 78 connected in a current mirror with the collector of the transistor 78 connected to the base and the emitters of both transistors connected to the ground, the base of the transistor 75 is connected to the emitter of the transistor 69 of the switch control circuit 62 through a resistor 79, the collector of the transistor 76 is connected to the collector of the transistor 22 through a resistor 80, and the collector of the transistor 77 is connected to the emitter of the transistor 22 through a resistor 81.

In this circuit, the current supplied to the collector of the transistor 22 and the current drawn from the emitter of the transistor 22 are made greater than the collector and emitter currents during the steady-state oscillation of the crystal oscillating circuit 2 by appropriately choosing the value of the resistor 74, for example.

Next, the operation of the crystal oscillator 1-22 with the above configuration is described below.

Here, since the crystal oscillating circuit 2 is a typical Colpitts oscillating circuit and its operation is already known, the description of the operation is omitted.

When the power supply voltage Vcc is applied, a charging current of the capacitor 70 begins to flow through the base and emitter of the transistor 69, the resistor 79, and the base and emitter of the transistor 75 at a time at which the power supply voltage reaches the base-emitter voltage of the transistor 69 plus that of the transistor 75. The charging current turns the transistor 69 ON, and a large base current is thereby supplied to the transistor 75 to turn the transistor 75 ON.

Consequently, the collector and base of the transistor 73 are connected to the ground through the resistor 74 and the start-up transistor 75, and a large collector current which is determined by the resistor 74 flows through the transistor 73. Because of the current mirror configuration, the same collector currents as that of the transistor 73 flow through the transistors 72, 76, 77, and 78. Therefore, a current determined by the current control circuit 68 flows from the collector to the emitter of the transistor 22 while the quick start-up circuit 303 is being activated as described below.

By this operation of the quick start-up circuit 3—3, the emitter voltage of the transistor 22 is rapidly pulled down and the collector voltage is rapidly pulled up. The steep fall of the emitter voltage of the transistor 22 is applied to one terminal of the crystal resonator 24 through the capacitor 25 to make the crystal resonator 24 begin to vibrate forcibly, charging the capacitor 25 quickly. Since the constant current source configuration has a very high resistance against alternating current, the quick start-up circuit 3—3 does not affect the oscillation of the crystal oscillating circuit 2. Further, since the same collector current as the emitter current is supplied, the saturation of the transistor 22 can be prevented and hence quicker start-up is made possible.

When the power supply voltage Vcc reaches the steady state a certain time after the power supply voltage Vcc is applied, the charging current of the capacitor 70 stops flowing. The quick start-up circuit 3—3 thereby stops functioning, and the transistors 76 and 77 that apply start-up quickening voltages to the crystal oscillating circuit 2 turn off. Consequently, the crystal oscillating circuit 2 can continue the steady-state oscillation without the influence of the quick start-up circuit 3—3.

Figure 27:
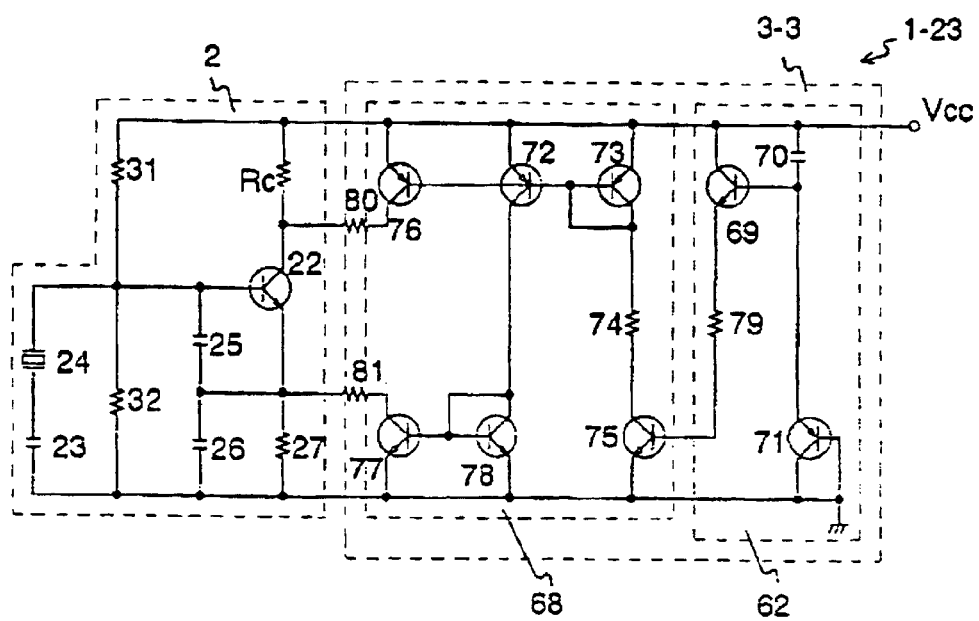
FIG. 27 is a schematic diagram of an embodiment of the crystal oscillator according to the present invention.

The crystal oscillating circuit 2 of the above crystal oscillator 1-22 may also be the single stage Colpitts crystal oscillating circuit 2 as of the crystal oscillator 1-23 shown in FIG. 27 instead of the crystal oscillating circuit 2 having a cascade amplifier circuit.

Further, the transistors 71 of these embodiments, which are connected up as a diode, performs the function of allowing the charge start-up on the capacitor 70 to discharge when the power supply voltage Vcc is removed, and ordinary diodes may also be used instead of the transistors.

In the above description, the present invention is described using as examples the crystal oscillators with quick start-up circuits 3 of the first type that applies a start-up quickening voltage to the base of the oscillating transistor of the crystal oscillating circuit or those with quick start-up circuits 3-1 to 3—3 of the second type that applies a start-up quickening voltage to the emitter or collector of the oscillating transistor of the crystal oscillating circuit. However, the present invention is not limited to them and may also be crystal oscillators with both quick start-up circuits 3 of the first type and those 3-1 to 3—3 of the second type.

Figure 28:
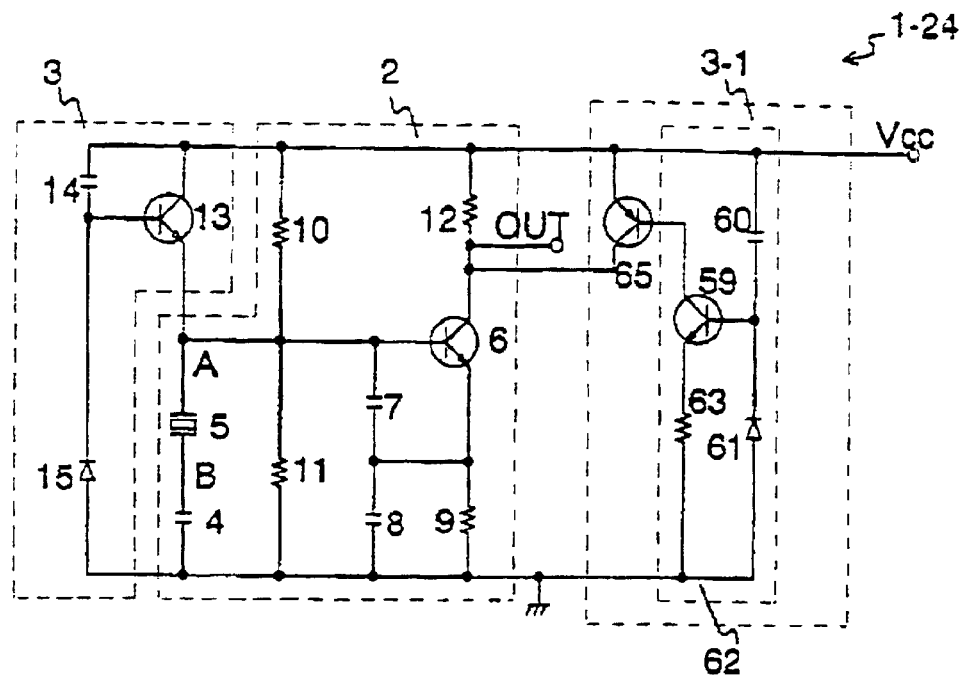
FIG. 28 is a schematic diagram of an embodiment of the crystal oscillator according to the present invention.
Figure 29:
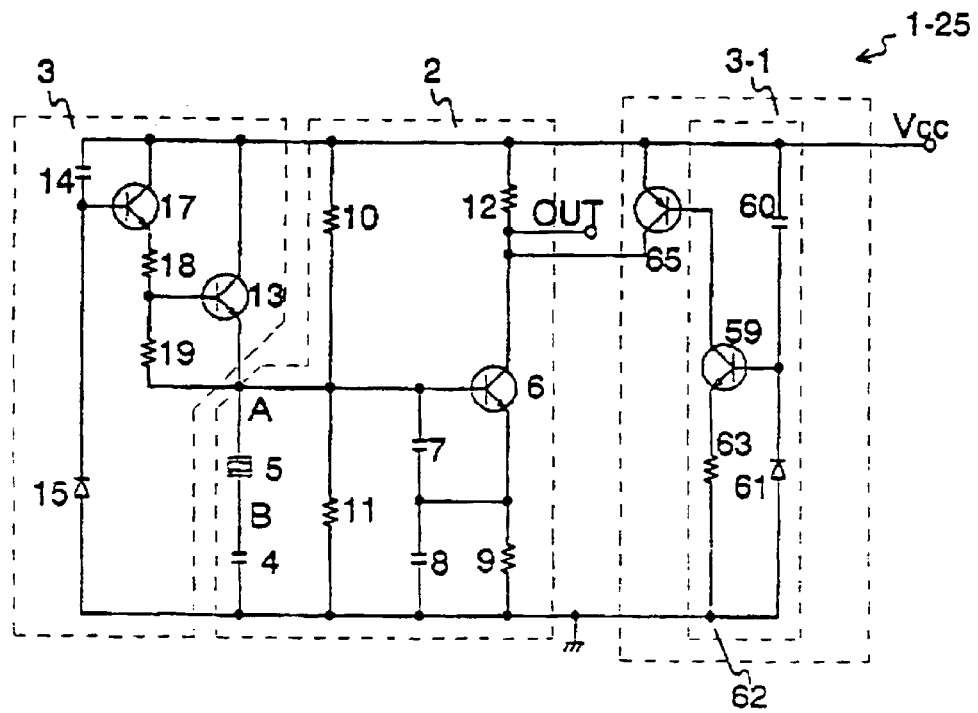
FIG. 29 is a schematic diagram of an embodiment of the crystal oscillator according to the present invention.

The crystal oscillator 1-24 shown in FIG. 28 is the crystal oscillator shown in FIG. 1 with the quick start-up circuit 3-1 shown in FIG. 18 added to. The crystal oscillator 1-25 shown in FIG. 29 is the crystal oscillator shown in FIG. 2 with the quick start-up circuit 3-1 shown in FIG. 18 added to.

The crystal oscillators of this configuration can start-up the crystal oscillating circuit further quicker than the crystal oscillators with quick start-up circuits of the second type, because the crystal resonator is made to vibrate forcibly immediately after the power supply voltage Vcc is applied by being provided with the first type of quick start-up circuit in addition to the second type of quick start-up circuit.

Figure 30:
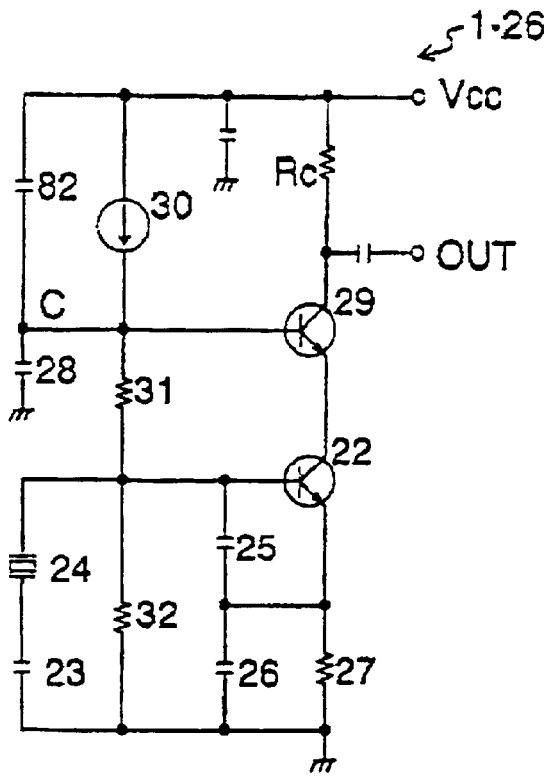
FIG. 30 is a schematic diagram of an embodiment of the crystal oscillator according to the present invention.

FIG. 30 shows other embodiments of the crystal oscillators according to the present invention.

The crystal oscillator 1-26 shown in FIG. 30 has the Colpitts crystal oscillating circuit shown in FIG. 5 as the oscillating circuit, and is characterized in that a capacitor 82 is connected between the power supply voltage Vcc line and the base of the transistor 29.

In the crystal oscillator 1-26 of this configuration, a charging current of the capacitor 82, which occurs immediately after the application of the power supply voltage Vcc, is supplied to the connection point C to the base of the transistor 29, and hence the voltage at the connection point C becomes close to the power supply voltage Vcc, it is possible to feed a large current to the bases of the transistor 29 and transistor 22 and also to apply a large start-up quickening voltage.

Although part of the current supplied to the connection point C flows to the capacitor 28, the effect of the capacitor 82 increasing the amount of current at the connection point C is greater, and hence the start-up characteristics does not degrade in comparison to the conventional circuit.

Further, although noise contained in the power supply voltage Vcc and thermal noise generated in the base bias circuit are supplied to the connection point C in the steady oscillation state, the noises flow to the ground through the capacitor 28 and do not degrade the noise characteristics of the crystal oscillator 1-26 by mixing with the oscillation signal.

Furthermore, the weights given to the start-up characteristics and the noise characteristics can be determined as desired by the capacitance ratio C82/C28 of the capacitance C82 of the capacitor 82 to the capacitance C28 of the capacitor 28. Greater importance can be attached to the start-up characteristics by using a greater capacitance ratio, and greater importance can be attached to the noise characteristics by using a smaller capacitance ratio. In the case of Pierce crystal oscillators, the following configurations may be used.

Figure 31:
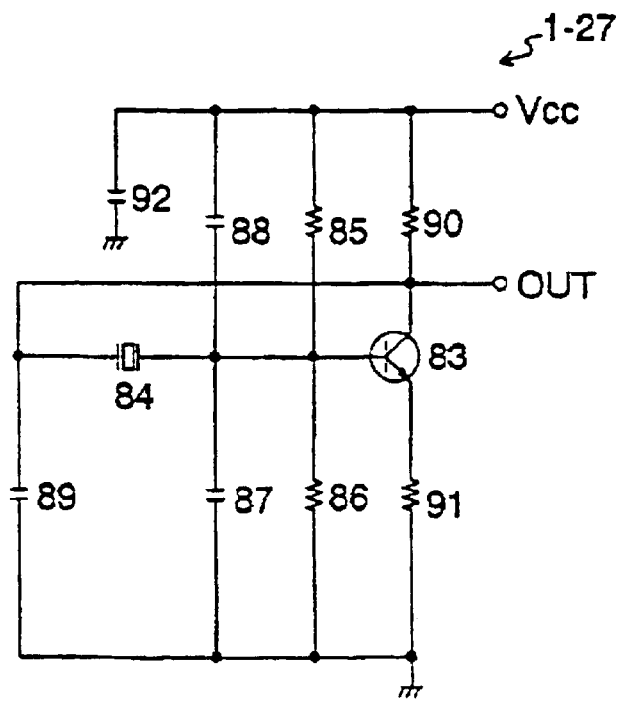
FIG. 31 is a schematic diagram of an embodiment of the crystal oscillator according to the present invention.

The crystal oscillator 1-27 shown in FIG. 31 has a configuration in which one terminal of the crystal resonator 84 is connected to the base of an oscillation transistor 83, resistors 85 and 86 are connected in series between the power supply voltage Vcc line and the ground and the base of the transistor 83 is connected to between the resistors 85 and 86, a capacitor 88 is connected between the power supply voltage Vcc line and the base of the transistor 83 and a capacitor 87 is connected between the base of the transistor 83 and the ground, the other terminal of the crystal resonator 84 is connected to the ground through a capacitor 89 and to the collector of the transistor 83 that is connected to the power supply voltage Vcc line through a collector resistor 90, and the emitter of the transistor 83 is connected to the ground through an emitter resistor 91.

Further, the capacitor 88 is connected to the ground via the power supply voltage Vcc line and a bypass capacitor 92. By this configuration, the capacitor 87 and the capacitor 88 are put in parallel connection between the base of the transistor 83 and the ground with respect to alternating current, and the combined capacitance of the capacitors 87 and 88 becomes the load capacitance of the oscillating circuit. In addition, the capacitances of the capacitors 87 and 88 are determined so that the capacitance ratio of the capacitors 87 to 88 is 6:4.

Since the level of the crystal resonator drive signal is proportional to the impedance of the load capacitance, the above load capacitance is a small value determined so that the drive signal of the crystal resonator 84 carried on the base current of the transistor 83 is within the class A amplification operation range of the transistor 83.

In addition, the values of the resistors 85, 86, 90, and 91 are also determined so that the transistor 83 performs call A amplification operation.

The operation of the crystal oscillator 1-27 of the above configuration is described below.

The charge current is supplied to one terminal of the crystal resonator 84 from the power supply voltage Vcc during the period of time from the charge current of the capacitor 88 beginning to flow immediately after the power supply voltage Vcc is switched on to the charge current stopping flowing, and the power supply voltage Vcc line and the crystal resonator 84 are directly connected. Therefore, compared to a conventional crystal oscillator in which the base voltage produced by dividing the power supply voltage Vcc is applied to the crystal resonator as the starting-up voltage (starting-up current source), the power supply Vcc, which is a high-voltage large current source, can be used as the starting-up current source, and hence it is possible to vibrate the crystal resonator strongly. As a result, the crystal oscillator 1-27 can start up quickly.

Then, when the capacitor 88 is charged up to the maximum and the charge current stops flowing, the capacitor 88, which served as the path of the starting-up current, serves as a part of the load capacitance, and the circuit enters the steady-state oscillating operation.

With the impedance value of the load capacitance and the set condition for the operation point of the transistor 83 described above, the crystal resonator 84 generates a low level drive signal, and the transistor 84 performs class A amplification operation. The crystal oscillator therefore can continue oscillating under the best condition for outputting a sinusoidal wave signal.

From the OUT output terminal, a sinusoidal wave signal can be obtained.

Furthermore, since the crystal oscillator 1-27 uses the capacitor 88, which is a part of the load capacitance, as the path for a starting-up current to the crystal resonator as described above, the change in the lord capacitance does not occur between the starting-up state and the steady state of the crystal oscillator. As a result, this crystal oscillator has an advantage that frequency variation represented by frequency jump does not occur.

Further, in the case where the values of the capacitances 87 and 88 are determined so that the capacitance ratio of the capacitor 87 to the capacitor 88 is 6:4, the crystal oscillator has a good start-up characteristics and output signal waveform characteristics on average.

In the case where the capacitance ratio of the capacitor 87 to the capacitor 88 is within a rang of 3:7 to 7:3, a start-up characteristics and an output signal waveform characteristics usable in practical use can be obtained. In addition, a high frequency stability that the change in the load capacitance against variation in the power supply voltage is smaller, in comparison with the configuration whose load capacitance is formed of a single capacitor 88, is confirmed.

Furthermore, the crystal oscillators of the configurations shown in FIGS. 32 to 35 can be used.

The crystal oscillators shown in FIGS. 32 to 35 all have a frequency control function.

Figure 32:
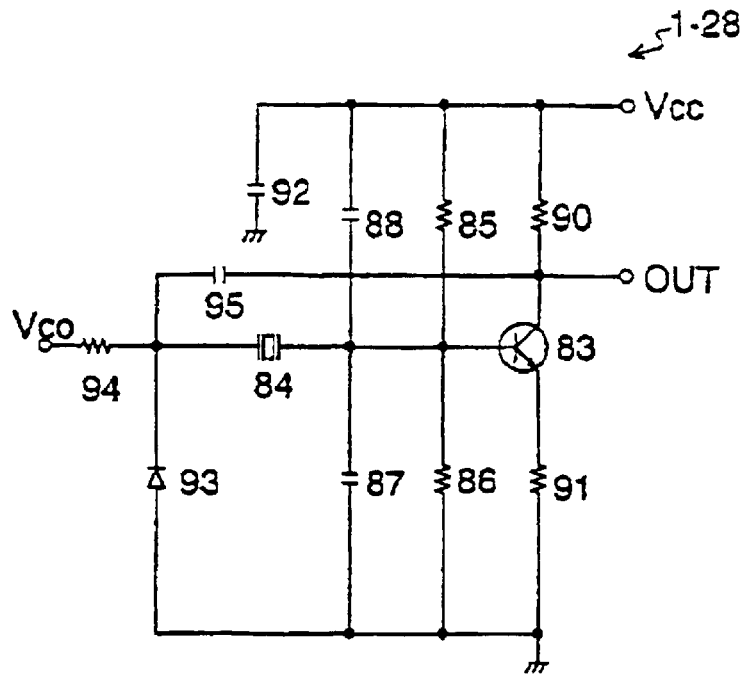
FIG. 32 is a schematic diagram of an embodiment of the crystal oscillator according to the present invention.

The crystal oscillator 1-28 shown in FIG. 32 is different from that of FIG. 30 in the configuration in which a variable capacitance element 93 is used in place of the capacitor 89, a voltage controller Vcc is connected, through a resistor 94, to the terminal of the crystal resonator 84 to which the variable capacitance element 93 is connected, and the collector of the transistor 83 is connected to the same terminal of the crystal resonator 84 through a dc-cut capacitor 94.

Figure 33:
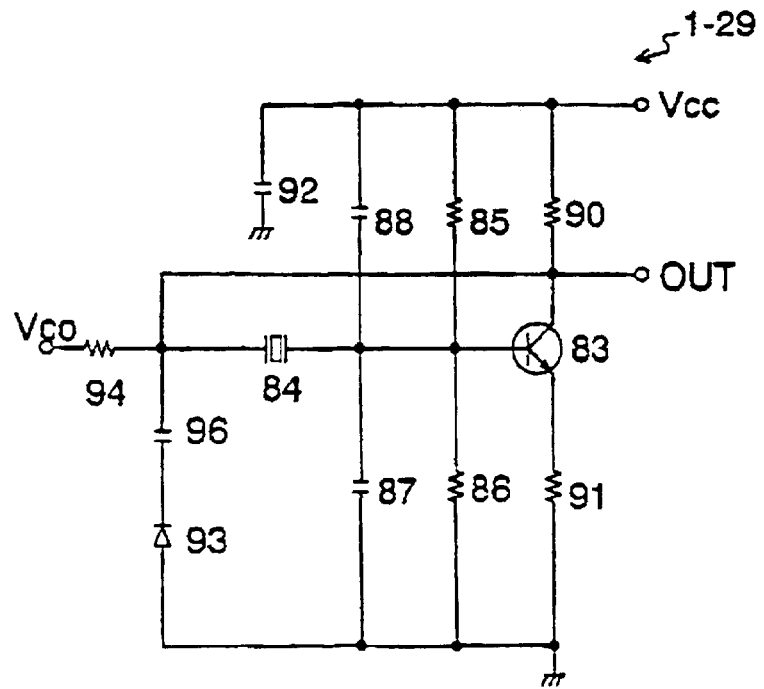
FIG. 33 is a schematic diagram of an embodiment of the crystal oscillator according to the present invention.

The crystal oscillator 1-29 shown in FIG. 33 is different from that of FIG. 30 in the configuration in which a capacitor 96 and a variable capacitance element 93 connected in series are used in place of the capacitor 87 with the capacitor 96 connected to the terminal of the crystal resonator 84, and a voltage controller Vcc is connected to between the capacitor 96 and the variable capacitance element 93 through a resistor 94.

These crystal oscillators 1-28 to 1-30 also have the same high performance as the crystal oscillator 1-27 shown in FIG. 31 by setting the load capacitance in the same condition as that of the crystal oscillator 1-27.

Figure 34:
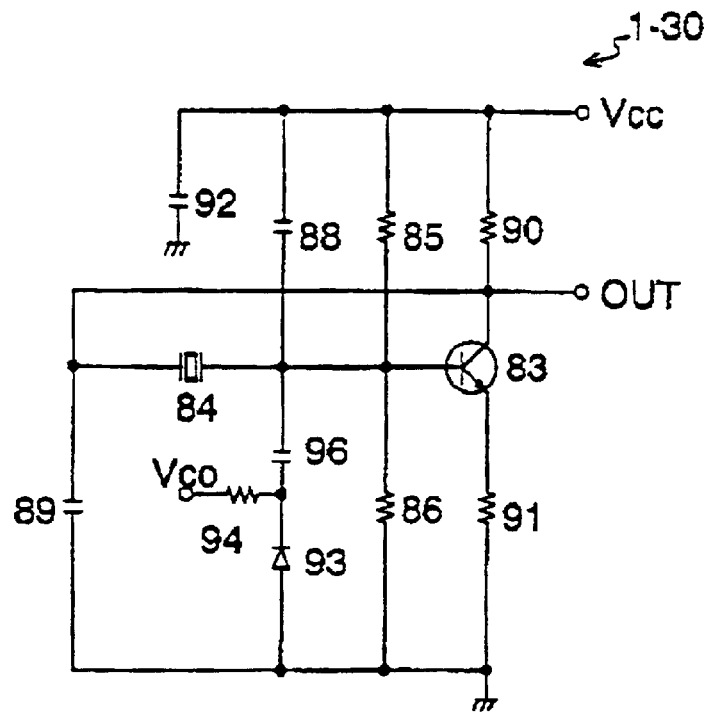
FIG. 34 is a schematic diagram of an embodiment of the crystal oscillator according to the present invention.
Figure 35:
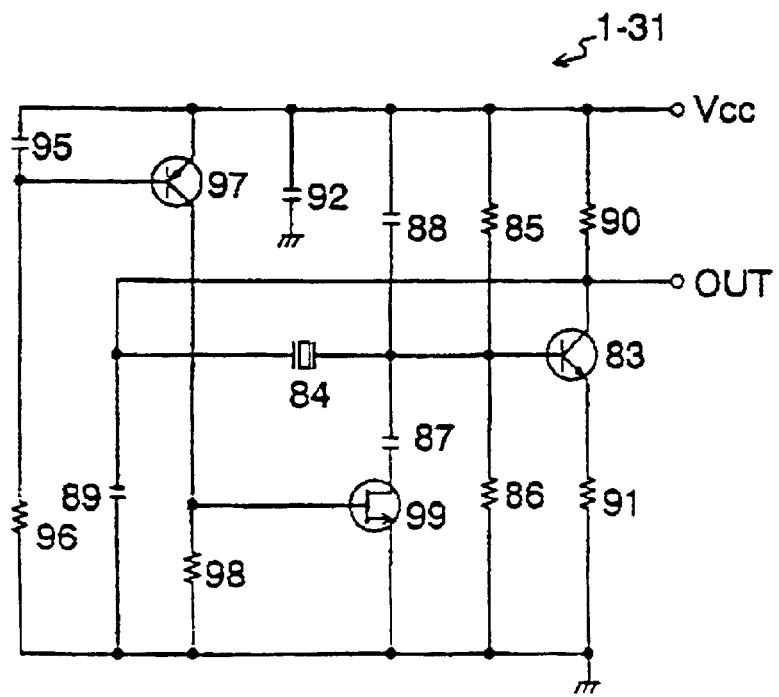
FIG. 35 is a schematic diagram of an embodiment of the crystal oscillator according to the present invention.

The crystal oscillator 1-31 shown in FIG. 34 is characterized in the configuration in which a third capacitor 95 and a first resistor 96 connected in series are connected between the power supply voltage Vcc line and the ground, the base of a PNP transistor 97 with the emitter connected to the power supply voltage Vcc line is connected to between the capacitor 95 and the resistor 96, the collector of the PNP transistor 97 is connected to the power supply voltage Vcc line through a second resistor 98, a capacitor 87 and a FET 99 connected in series are connected between the base of the transistor 83 and the ground with the drain connected to the ground, and the gate of the FET 99 is connected to the collector of the PNP transistor 97.

In the crystal oscillator 1-31 of the configuration described above, the transistor 97 is off while a charging current of the capacitor 95 is flowing just after the power supply voltage Vcc is switched on because the base voltage of the transistor 97 is about the same as the power supply voltage. Since the gate voltage is 0V while the transistor 97 is off, the FET is also off.

Because of the off state of the FET 99, the serial circuit of the capacitor 87 and the FET 99 is kept at a high impedance. Therefore, the crystal resonator 84 is started up by the power supply voltage through the capacitor 88. Further, the crystal resonator 84 outputs a high level drive signal. As a result, the crystal oscillator 1-31 has a quick start-up characteristics.

In the steady oscillating state after the charging current of the capacitor 95 stops flowing, the transistor 97 turns ON, and hence the FET 99 turns ON. Therefore, the base of the transistor 83 is connected to the ground through the capacitor 87. Further, the crystal resonator 84 can output a low level drive signal needed for the class A amplification operation of the transistor 83.

Although crystal resonators are used in the embodiments described above, the present invention is not limited to the crystal oscillators, and can be applied to piezo oscillators using any types of piezo resonators.

Further, although Colpitts oscillators are used in the above description of the piezo oscillators with quick starter circuits of the present invention, the present invention can also be applied to piezo oscillators with quick starter circuits using Pierce oscillators or any other oscillators.

Figure 36:
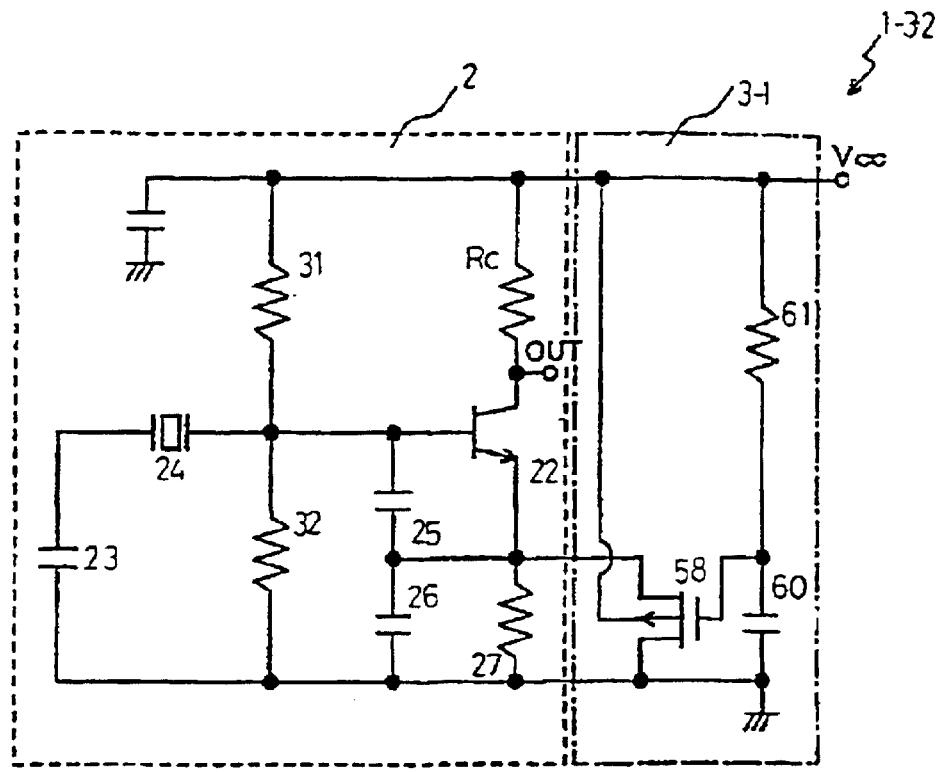
FIG. 36 is a schematic diagram of an embodiment of the crystal oscillator according to the present invention.
Figure 37:
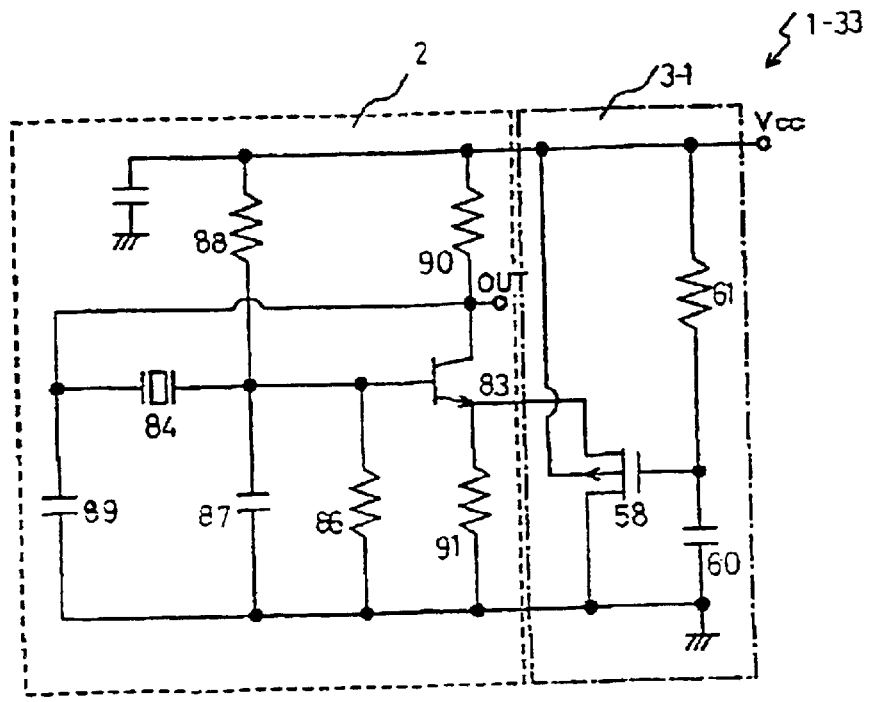
FIG. 37 is a schematic diagram of an embodiment of the crystal oscillator according to the present invention.
Figure 38:
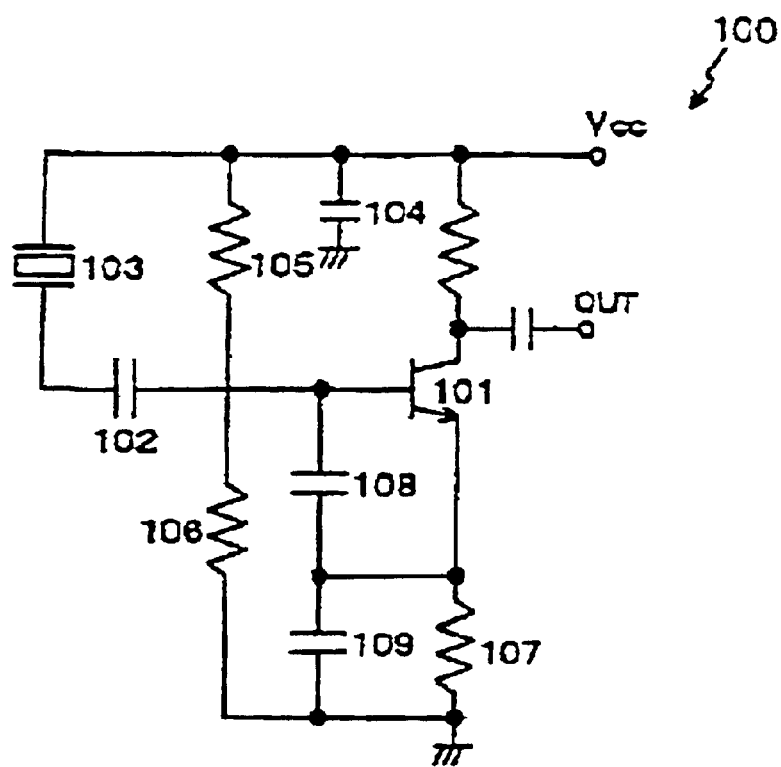
FIG. 38 is a schematic diagram of a conventional crystal oscillator.

Furthermore, although circuit configuration using bipolar transistors are used in the above description of the piezo oscillators of the present invention, the present invention can also be applied to piezo oscillators using FET(s) as shown in FIGS. 36 and 37.

The crystal oscillators 1-32 and 1-33 shown in FIGS. 36 and 37 are characterized in that a MOS FET is used as the switch device. The oscillating circuit of the crystal oscillator 1-32 is a Colpitts-type crystal oscillator, and the oscillating circuit of the crystal oscillator 1-33 is a Pierce-type crystal oscillator.

The quick starter circuits 3-1 of the crystal oscillators 1-32 and 1-33 have the same configuration in which the base of a depletion type p-channel FET is connected to the power supply voltage Vcc line, the gate of the depletion type p-channel FET is connected to between a resistor and a capacitor connected in series between the power supply voltage Vcc line and the ground, and the source to drain of the depletion type p-channel FET is connected in parallel with the emitter resistor of the oscillating transistor.

In the crystal oscillators 1-32 and 1-33, the FET is turned ON in a predetermined length of time after the application of the power supply voltage Vcc to vibrate the crystal resonator forcibly. As a result, the start-up time of the crystal oscillators 1-32 and 1-33 can be shortened.

Further, in the configurations in which a capacitor or capacitors are used as the voltage dividing element in the base bias circuit(s) for the switching transistor(s), any semiconductor element or element formed in integrated circuit which can perform the equivalent function as the capacitor (s) can be used in place of the capacitor(s).

As described above, the piezo oscillators according to the present invention is equipped with a momentary voltage supply means for applying a start-up quickening voltage to the piezo oscillator only for a predetermined length of time after the application of power supply voltage, and by this configuration the start-up time which the piezo oscillators take to reach the steady oscillating state from the non-oscillating state is significantly shortened. The start-up quickening voltage is removed after the predetermined length of time, and hence the phase noise characteristics and the frequency stability characteristics of the piezo oscillators are not affected by the momentary voltage supply means.

What is claimed is:

1. A piezo oscillator characterized in that:
    the piezo oscillator contains a piezo resonator, oscillating transistor, and two quick start-up circuits;
    a first quick start-up circuit applies a start-up quickening voltage to the piezo resonator only for a predetermined length of time after the application of the power supply voltage Vcc; and
    a second quick start-up circuit increases the collector current of the oscillating transistor only for a predetermined length of time after the application of the power supply voltage Vcc.

2. A piezo oscillator characterized in that:
    the piezo oscillator contains a piezo resonator, oscillating transistor, and two quick start-up circuits;
    the quick start-up circuits each have one or more switch circuits;
    a first quick start-up circuit applies the power supply voltage Vcc to the piezo resonator as a start-up quickening voltage through the switch circuit only for a predetermined length of time after the application of the power supply voltage Vcc; and
    a second quick start-up circuit bypasses an emitter resistor, a collector resistor, or both of the oscillating transistor through the switch circuit or switch circuits to increase the collector current of the oscillating transistor only for a predetermined length of time after the application of the power supply voltage Vcc.

3. A piezo oscillator comprising a quick start-up circuit and an oscillation circuit that contains a piezo resonator and an amplifying circuit, wherein
    said quick start-up circuit is comprised of:
        a bypass transistor switch that bypasses predetermined circuit portions of said oscillation circuit,
        a control transistor switch that makes ON/OFF controls of said bypass transistor switch, and
        a capacitor connected to a base of said control transistor switch; and
    said quick start-up circuit functions so that for a predetermined length of time between application of power supply voltage Vcc and completion of charging of electrical charge to said capacitor, a charge current according to said charging of said electrical charge is supplied to said control transistor switch, thus activating ON operation of said control transistor switch and bypass transistor switch; and
    changes in operation conditions of said oscillation circuit by said ON operation temporaly increase electric current that flows in said piezo resonator to forcibly vibrato said piezo resonator, thus making start-up of said piezo oscillator faster.

4. The piezo oscillator according to claim 3, wherein
    said quick start-up circuit is comprised of a first NPN transistor, which is said bypass transistor, and a second NPN transistor which, is said control transistor, and is structured so that:
        said first NPN transistor is connected, in forward polarity, between said power supply voltage Vcc line and one terminal of said piezo resonator,
        a resister is inserted and connected between a base and an emitter of said first NPN transistor,
        said second NPN transistor is connected, in forward polarity, between said power supply voltage Vcc line and a base of said first NPN transistor, and
        said capacitor is inserted and connected between said power supply voltage Vcc line and a base of said second NPN transistor; and wherein
    a start-up quickening voltage is applied, for a predetermined length of time after application of said power supply voltage Vcc, to said piezo resonator from said power supply voltage Vcc line via said first NPN transistor, thus temporarily increasing electric current that flows in said piezo resonator so as to forcibly vibrate said piezo resonator, and making start-up of said piezo oscillator faster.

5. The piezo oscillator according to claim 3, wherein according to rise of voltage of said power supply voltage Vcc and for a predetermined length of time altar application of said power supply voltage Vcc, said quick start-up circuit outputs start-up quickening voltage that has steeper rise characteristics than the rise characteristics of said power supply voltage Vcc.

6. The piezo oscillator according to claim 3, wherein
    said amplifying circuit contains an oscillating transistor, a second quick start-up circuit, and a collector resistor for said oscillating transistor, and
    said collector resister is inserted and connected between a collector and an emitter of a second bypass transistor switch in said second quick start-up circuit,
    wherein in said second quick start-up circuit comprises:
        a base of a second control transistor switch and said power supply voltage Vcc line are connected via a second capacitor, and
        a collector of said second control transistor switch and a base of said second bypass transistor switch are connected; and wherein
    with a control of an ON/OFF operation of said second control transistor switch according to a charge current of said second capacitor, terminals of collector resister of said oscillating transistor are connected by said second bypass transistor switch for a predetermined length of time after application of power supply voltage Vcc so as to increase collector current of said oscillating transistor, thus temporarily increasing electric current that flows in said piezo resonator so as to forcibly vibrate said piezo resonator and to shorten start-up time of said piezo oscillator and after said predetermined length of time, a control by said second quick start-up circuit is stopped end hector current of maid oscillating transistor switch is lowered to desired level.

7. The piezo oscillator according to claim 3, wherein said amplifying circuit contains an oscillating transistor and said quick start-up circuit and a second quick start-up circuit;

said quick start-up circuit applies, for a predetermined length of time after application of power supply voltage Vcc, power source voltage Vcc to said piezo resonator as an oscillation quickening voltage via said transistor switch provided in said quick start-up circuit; and said second quick start-up circuit, for a predetermined length of time after application of said power supply voltage Vcc, increases collector current by bypassing a collector resister or a emitter resister or collector and emitter resisters with a bypass transistor switch provided in said second quick start-up circuit.

8. A piezo oscillator comprising a quick start-up circuit and an oscillation circuit that contains a piezo resonator and an amplifying circuit, said quick start-up circuit is comprised of:
 a single NPN transistor having functions of a bypass transistor switch in forward polarity between a power supply voltage Vcc line and one terminal of said piezo resonator, and
 a capacitor connected to a base of said single NPN transistor,
 and said single NPN transistor bypasses predetermined circuit portions of said oscillation circuit, said capacitor provided said power supply voltage Vcc line and a base of NPN transistor, and wherein a start-up quickening voltage is applied, for said predetermined length of time, to said piezo resonator from said power supply voltage Vcc line via said NPN transistor, thus temporarily increasing electric current that flows in said piezo resonator to forcibly vibrate said piezo resonator, and making start-up of said piezo faster.

\* \* \* \* \*